(12) United States Patent
Sheen et al.

(10) Patent No.: US 10,674,293 B2
(45) Date of Patent: Jun. 2, 2020

(54) CONCURRENT MULTI-DRIVER CALIBRATION

(71) Applicant: Sonos, Inc., Santa Barbara, CA (US)

(72) Inventors: Timothy Sheen, Brighton, MA (US); Aurelio Ramos, Jamaica Plain, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 16/542,433

(22) Filed: Aug. 16, 2019

(65) Prior Publication Data
US 2019/0373384 A1    Dec. 5, 2019

Related U.S. Application Data

(63) Continuation of application No. 16/181,583, filed on Nov. 6, 2018, now Pat. No. 10,390,159, which is a
(Continued)

(51) Int. Cl.
*H04R 3/00* (2006.01)
*H04R 29/00* (2006.01)
(Continued)

(52) U.S. Cl.
CPC .......... *H04R 29/001* (2013.01); *G06F 3/165* (2013.01); *H03G 3/20* (2013.01); *H03G 5/005* (2013.01);
(Continued)

(58) Field of Classification Search
CPC ... H04R 3/00; H04R 3/04; H04R 3/12; H04R 29/00; H04R 29/001; H04R 29/008;
(Continued)

(56) References Cited

U.S. PATENT DOCUMENTS

| 4,306,113 A | 12/1981 | Morton |
| 4,342,104 A | 7/1982 | Jack |

(Continued)

FOREIGN PATENT DOCUMENTS

| CN | 1447624 A | 10/2003 |
| CN | 1984507 A | 6/2007 |

(Continued)

OTHER PUBLICATIONS

Advisory Action dated Jul. 1, 2019, issued in connection with U.S. Appl. No. 15/229,693, filed Aug. 5, 2016, 2 pages.
(Continued)

*Primary Examiner* — Thang V Tran
(74) *Attorney, Agent, or Firm* — McDonnell Boehnen Hulbert & Berghoff LLP

(57) ABSTRACT

Examples involve calibration of a playback device including multiple audio transducers. An example implementation involves forming a particular playback configuration that configures the multiple audio transducers to form two or more channels and receiving a command to initiate calibration of the particular playback configuration. The calibration includes emitting a calibration sound according to a sequence that involves the calibration sound cycling through frequencies of a calibration frequency range. Based on the command, the playback device emits the calibration sound contemporaneously via the two or more channels. Emission of the calibration sound by each channel is staggered such that each emitted calibration sound is delayed relative to a preceding emitted calibration sound. The playback device receives audio processing coefficients that are based on one or more recordings of the emitted calibration sound; and applies the audio processing coefficients when playing back the audio content as part of the particular playback configuration.

20 Claims, 14 Drawing Sheets

Related U.S. Application Data continuation of application No. 15/909,529, filed on Mar. 1, 2018, now Pat. No. 10,129,674, which is a continuation of application No. 15/478,770, filed on Apr. 4, 2017, now Pat. No. 9,913,057, which is a continuation of application No. 14/805,340, filed on Jul. 21, 2015, now Pat. No. 9,648,422.

(51) Int. Cl.

| | | |
|---|---|---|
| *H03G 5/00* | (2006.01) | |
| *H03G 5/16* | (2006.01) | |
| *H04R 1/22* | (2006.01) | |
| *H04R 3/04* | (2006.01) | |
| *H04R 3/12* | (2006.01) | |
| *H04R 5/04* | (2006.01) | |
| *H04R 27/00* | (2006.01) | |
| *H04S 1/00* | (2006.01) | |
| *H04S 7/00* | (2006.01) | |
| *G06F 3/16* | (2006.01) | |
| *H03G 3/20* | (2006.01) | |

(52) U.S. Cl.
CPC ............ *H03G 5/16* (2013.01); *H03G 5/165* (2013.01); *H04R 1/22* (2013.01); *H04R 3/04* (2013.01); *H04R 3/12* (2013.01); *H04R 5/04* (2013.01); *H04R 27/00* (2013.01); *H04R 29/008* (2013.01); *H04S 1/007* (2013.01); *H04S 7/301* (2013.01); *H04R 2227/005* (2013.01)

(58) Field of Classification Search
CPC .......... H04R 2227/005; H04R 2420/07; H04R 27/00; H04R 1/22; H04R 5/00; H04R 5/02; H04R 5/04; H03G 5/005; H03G 5/16; H03G 5/165; H03G 3/20; G06F 3/165; H04S 7/301; H04S 7/307; H04S 1/007

See application file for complete search history.

(56) References Cited

U.S. PATENT DOCUMENTS

| | | |
|---|---|---|
| 4,504,704 A | 3/1985 | Ohyaba et al. |
| 4,592,088 A | 5/1986 | Shimada |
| 4,628,530 A | 12/1986 | Op et al. |
| 4,631,749 A | 12/1986 | Rapaich |
| 4,694,484 A | 9/1987 | Atkinson et al. |
| 4,773,094 A | 9/1988 | Dolby |
| 4,995,778 A | 2/1991 | Bruessel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |
| 5,440,644 A | 8/1995 | Farinelli et al. |
| 5,553,147 A | 9/1996 | Pineau |
| 5,581,621 A | 12/1996 | Koyama et al. |
| 5,757,927 A | 5/1998 | Gerzon et al. |
| 5,761,320 A | 6/1998 | Farinelli et al. |
| 5,910,991 A | 6/1999 | Farrar |
| 5,923,902 A | 7/1999 | Inagaki |
| 5,939,656 A | 8/1999 | Suda |
| 6,018,376 A | 1/2000 | Nakatani |
| 6,032,202 A | 2/2000 | Lea et al. |
| 6,072,879 A | 6/2000 | Ouchi et al. |
| 6,111,957 A | 8/2000 | Thomasson |
| 6,256,554 B1 | 7/2001 | DiLorenzo |
| 6,363,155 B1 | 3/2002 | Horbach |
| 6,404,811 B1 | 6/2002 | Cvetko et al. |
| 6,469,633 B1 | 10/2002 | Wachter |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,757,517 B2 | 6/2004 | Chang et al. |
| 6,760,451 B1 | 7/2004 | Craven et al. |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,031,476 B1 | 4/2006 | Chrisop et al. |
| 7,039,212 B2 | 5/2006 | Poling et al. |
| 7,058,186 B2 | 6/2006 | Tanaka |
| 7,072,477 B1 | 7/2006 | Kincaid |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsuk et al. |
| 7,391,791 B2 | 6/2008 | Balassanian et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | McKee |
| 7,676,044 B2 | 3/2010 | Sasaki et al. |
| 7,689,305 B2 | 3/2010 | Kreifeldt et al. |
| 7,720,237 B2 | 5/2010 | Bharitkar et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,876,903 B2 | 1/2011 | Sauk |
| 7,925,203 B2 | 4/2011 | Lane et al. |
| 7,949,140 B2 | 5/2011 | Kino |
| 7,949,707 B2 | 5/2011 | McDowell et al. |
| 7,961,893 B2 | 6/2011 | Kino |
| 7,970,922 B2 | 6/2011 | Svendsen |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | McCarty et al. |
| 8,116,476 B2 | 2/2012 | Inohara |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pdersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |

(56) References Cited

U.S. PATENT DOCUMENTS

| | | |
|---|---|---|
| 8,229,125 B2 | 7/2012 | Short |
| 8,233,632 B1 | 7/2012 | MacDonald et al. |
| 8,234,395 B2 | 7/2012 | Millington |
| 8,238,547 B2 | 8/2012 | Ohki et al. |
| 8,238,578 B2 | 8/2012 | Aylward |
| 8,243,961 B1 | 8/2012 | Morrill |
| 8,264,408 B2 | 9/2012 | Kainulainen et al. |
| 8,265,310 B2 | 9/2012 | Berardi et al. |
| 8,270,620 B2 | 9/2012 | Christensen et al. |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,325,944 B1 | 12/2012 | Duwenhorst et al. |
| 8,331,585 B2 | 12/2012 | Hagen et al. |
| 8,332,414 B2 | 12/2012 | Nguyen et al. |
| 8,379,876 B2 | 2/2013 | Zhang |
| 8,391,501 B2 | 3/2013 | Khawand et al. |
| 8,392,505 B2 | 3/2013 | Haughay et al. |
| 8,401,202 B2 | 3/2013 | Brooking |
| 8,433,076 B2 | 4/2013 | Zurek et al. |
| 8,452,020 B2 | 5/2013 | Gregg et al. |
| 8,463,184 B2 | 6/2013 | Dua |
| 8,483,853 B1 | 7/2013 | Lambourne |
| 8,488,799 B2 | 7/2013 | Goldstein |
| 8,503,669 B2 | 8/2013 | Mao |
| 8,527,876 B2 | 9/2013 | Wood et al. |
| 8,577,045 B2 | 11/2013 | Gibbs |
| 8,577,048 B2 | 11/2013 | Chaikin et al. |
| 8,600,075 B2 | 12/2013 | Lim |
| 8,620,006 B2 | 12/2013 | Berardi et al. |
| 8,682,002 B2 | 3/2014 | Wihardja |
| 8,731,206 B1 | 5/2014 | Park |
| 8,755,538 B2 | 6/2014 | Kwon |
| 8,798,280 B2 | 8/2014 | Goldberg et al. |
| 8,819,554 B2 | 8/2014 | Basso et al. |
| 8,831,244 B2 | 9/2014 | Apfel |
| 8,855,319 B2 | 10/2014 | Liu et al. |
| 8,862,273 B2 | 10/2014 | Karr |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann et al. |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,996,370 B2 | 3/2015 | Ansell |
| 9,020,153 B2 | 4/2015 | Britt, Jr. |
| 9,021,153 B2 | 4/2015 | Lu |
| 9,065,929 B2 | 6/2015 | Chen et al. |
| 9,084,058 B2 | 7/2015 | Reilly et al. |
| 9,100,766 B2 | 8/2015 | Soulodre et al. |
| 9,106,192 B2 | 8/2015 | Sheen et al. |
| 9,179,233 B2 | 11/2015 | Kang |
| 9,215,545 B2 | 12/2015 | Dublin et al. |
| 9,219,460 B2 | 12/2015 | Bush |
| 9,231,545 B2 | 1/2016 | Agustin et al. |
| 9,286,384 B2 | 3/2016 | Kuper et al. |
| 9,288,597 B2 | 3/2016 | Carlsson et al. |
| 9,300,266 B2 | 3/2016 | Grokop |
| 9,319,816 B1 | 4/2016 | Narayanan |
| 9,451,377 B2 | 9/2016 | Massey et al. |
| 9,462,399 B2 | 10/2016 | Bharitkar et al. |
| 9,467,779 B2 | 10/2016 | Iyengar et al. |
| 9,472,201 B1 | 10/2016 | Sleator |
| 9,489,948 B1 | 11/2016 | Chu et al. |
| 9,524,098 B2 | 12/2016 | Griffiths et al. |
| 9,538,305 B2 | 1/2017 | Lehnert et al. |
| 9,538,308 B2 | 1/2017 | Isaac et al. |
| 9,560,449 B2 | 1/2017 | Carlsson et al. |
| 9,560,460 B2 | 1/2017 | Chaikin et al. |
| 9,609,383 B1 | 3/2017 | Hirst |
| 9,615,171 B1 | 4/2017 | O'Neill et al. |
| 9,648,422 B2 | 5/2017 | Sheen et al. |
| 9,674,625 B2 | 6/2017 | Armstrong-Muntner et al. |
| 9,678,708 B2 | 6/2017 | Bierbower et al. |
| 9,689,960 B1 | 6/2017 | Barton et al. |
| 9,690,271 B2 | 6/2017 | Sheen et al. |
| 9,690,539 B2 | 6/2017 | Sheen et al. |
| 9,706,323 B2 | 7/2017 | Sheen et al. |
| 9,715,365 B2 | 7/2017 | Kusano et al. |
| 9,723,420 B2 | 8/2017 | Family et al. |
| 9,736,584 B2 | 8/2017 | Sheen et al. |
| 9,743,207 B1 | 8/2017 | Hartung |
| 9,743,208 B2 | 8/2017 | Oishi et al. |
| 9,749,763 B2 | 8/2017 | Sheen |
| 9,763,018 B1 | 9/2017 | McPherson et al. |
| 9,781,532 B2 | 10/2017 | Sheen |
| 9,788,113 B2 | 10/2017 | Wilberding et al. |
| 9,860,662 B2 | 1/2018 | Jarvis et al. |
| 9,864,574 B2 | 1/2018 | Hartung et al. |
| 9,910,634 B2 | 3/2018 | Sheen et al. |
| 9,913,056 B2 | 3/2018 | Master et al. |
| 9,916,126 B2 | 3/2018 | Lang |
| 9,952,825 B2 | 4/2018 | Sheen |
| 10,045,142 B2 | 8/2018 | McPherson et al. |
| 10,154,359 B2 | 12/2018 | Sheen |
| 10,206,052 B2 | 2/2019 | Perianu |
| 2001/0038702 A1 | 11/2001 | Lavoie et al. |
| 2001/0042107 A1 | 11/2001 | Palm |
| 2001/0043592 A1 | 11/2001 | Jimenez et al. |
| 2001/0053228 A1 | 12/2001 | Jones |
| 2002/0022453 A1 | 2/2002 | Balog et al. |
| 2002/0026442 A1 | 2/2002 | Lipscomb et al. |
| 2002/0078161 A1 | 6/2002 | Cheng |
| 2002/0089529 A1 | 7/2002 | Robbin |
| 2002/0124097 A1 | 9/2002 | Isely et al. |
| 2002/0126852 A1 | 9/2002 | Kashani et al. |
| 2002/0136414 A1 | 9/2002 | Jordan et al. |
| 2002/0146136 A1 | 10/2002 | Carter et al. |
| 2003/0002689 A1 | 1/2003 | Folio |
| 2003/0031334 A1 | 2/2003 | Layton et al. |
| 2003/0157951 A1 | 8/2003 | Hasty |
| 2003/0161479 A1 | 8/2003 | Yang et al. |
| 2003/0161492 A1 | 8/2003 | Miller et al. |
| 2003/0179891 A1 | 9/2003 | Rabinowitz et al. |
| 2003/0235311 A1 | 12/2003 | Grancea et al. |
| 2004/0024478 A1 | 2/2004 | Hans et al. |
| 2004/0131338 A1 | 7/2004 | Asada et al. |
| 2004/0237750 A1 | 12/2004 | Smith et al. |
| 2005/0031143 A1 | 2/2005 | Devantier et al. |
| 2005/0063554 A1 | 3/2005 | Devantier et al. |
| 2005/0147261 A1 | 7/2005 | Yen |
| 2005/0157885 A1 | 7/2005 | Olney et al. |
| 2006/0008256 A1 | 1/2006 | Khedouri et al. |
| 2006/0026521 A1 | 2/2006 | Hotelling et al. |
| 2006/0032357 A1 | 2/2006 | Roovers et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0025559 A1 | 2/2007 | Mihelich et al. |
| 2007/0032895 A1 | 2/2007 | Nackvi et al. |
| 2007/0038999 A1 | 2/2007 | Millington |
| 2007/0086597 A1 | 4/2007 | Kino |
| 2007/0116254 A1 | 5/2007 | Looney et al. |
| 2007/0121955 A1 | 5/2007 | Johnston et al. |
| 2007/0142944 A1 | 6/2007 | Goldberg et al. |
| 2008/0002839 A1 | 1/2008 | Eng |
| 2008/0014989 A1 | 1/2008 | Sandegard et al. |
| 2008/0065247 A1* | 3/2008 | Igoe .................. H04L 12/2809 700/94 |
| 2008/0069378 A1 | 3/2008 | Rabinowitz et al. |
| 2008/0077261 A1 | 3/2008 | Baudino et al. |
| 2008/0098027 A1 | 4/2008 | Aarts |

(56) References Cited

U.S. PATENT DOCUMENTS

| | | | |
|---|---|---|---|
| 2008/0136623 A1 | 6/2008 | Calvarese | |
| 2008/0144864 A1 | 6/2008 | Huon et al. | |
| 2008/0175411 A1 | 7/2008 | Greve | |
| 2008/0214160 A1 | 9/2008 | Jonsson | |
| 2008/0232603 A1 | 9/2008 | Soulodre et al. | |
| 2008/0266385 A1* | 10/2008 | Smith | H04N 7/15 348/14.09 |
| 2008/0281523 A1 | 11/2008 | Dahl et al. | |
| 2009/0003613 A1 | 1/2009 | Christensen et al. | |
| 2009/0024662 A1 | 1/2009 | Park et al. | |
| 2009/0047993 A1 | 2/2009 | Vasa | |
| 2009/0063274 A1 | 3/2009 | Dublin, III et al. | |
| 2009/0110218 A1 | 4/2009 | Swain | |
| 2009/0138507 A1 | 5/2009 | Burckart et al. | |
| 2009/0147134 A1 | 6/2009 | Iwamatsu | |
| 2009/0175476 A1 | 7/2009 | Bottum | |
| 2009/0180632 A1 | 7/2009 | Goldberg et al. | |
| 2009/0196428 A1 | 8/2009 | Kim | |
| 2009/0202082 A1 | 8/2009 | Bharitkar et al. | |
| 2009/0252481 A1 | 10/2009 | Ekstrand | |
| 2009/0304194 A1 | 12/2009 | Eggleston et al. | |
| 2009/0304205 A1 | 12/2009 | Hardacker et al. | |
| 2009/0316923 A1* | 12/2009 | Tashev | H04M 9/082 381/66 |
| 2010/0013550 A1* | 1/2010 | Tanaka | G05F 3/205 327/540 |
| 2010/0095332 A1 | 4/2010 | Gran et al. | |
| 2010/0128902 A1 | 5/2010 | Liu et al. | |
| 2010/0135501 A1 | 6/2010 | Corbett et al. | |
| 2010/0142735 A1 | 6/2010 | Yoon et al. | |
| 2010/0146445 A1 | 6/2010 | Kraut | |
| 2010/0162117 A1 | 6/2010 | Basso et al. | |
| 2010/0189203 A1 | 7/2010 | Wilhelmsson et al. | |
| 2010/0195846 A1 | 8/2010 | Yokoyama | |
| 2010/0272270 A1 | 10/2010 | Chaikin et al. | |
| 2010/0296659 A1 | 11/2010 | Tanaka | |
| 2010/0303248 A1 | 12/2010 | Tawada | |
| 2010/0303250 A1 | 12/2010 | Goldberg et al. | |
| 2010/0323793 A1 | 12/2010 | Andall | |
| 2011/0007904 A1 | 1/2011 | Tomoda et al. | |
| 2011/0007905 A1 | 1/2011 | Sato et al. | |
| 2011/0087842 A1 | 4/2011 | Lu et al. | |
| 2011/0091055 A1 | 4/2011 | Leblanc | |
| 2011/0135103 A1 | 6/2011 | Sun et al. | |
| 2011/0150228 A1 | 6/2011 | Yoon et al. | |
| 2011/0150230 A1 | 6/2011 | Tanaka | |
| 2011/0170710 A1 | 7/2011 | Son | |
| 2011/0234480 A1 | 9/2011 | Fino et al. | |
| 2011/0235808 A1 | 9/2011 | Kon | |
| 2011/0268281 A1 | 11/2011 | Florencio et al. | |
| 2012/0032928 A1 | 2/2012 | Alberth et al. | |
| 2012/0051558 A1 | 3/2012 | Kim et al. | |
| 2012/0057724 A1 | 3/2012 | Rabinowitz et al. | |
| 2012/0063615 A1 | 3/2012 | Crockett et al. | |
| 2012/0093320 A1 | 4/2012 | Flaks et al. | |
| 2012/0127831 A1 | 5/2012 | Gicklhorn et al. | |
| 2012/0140936 A1 | 6/2012 | Bonnick et al. | |
| 2012/0148075 A1 | 6/2012 | Goh et al. | |
| 2012/0183156 A1 | 7/2012 | Schlessinger et al. | |
| 2012/0213391 A1 | 8/2012 | Usami et al. | |
| 2012/0215530 A1 | 8/2012 | Harsch et al. | |
| 2012/0237037 A1 | 9/2012 | Ninan et al. | |
| 2012/0243697 A1 | 9/2012 | Frye et al. | |
| 2012/0263325 A1 | 10/2012 | Freeman et al. | |
| 2012/0268145 A1 | 10/2012 | Chandra et al. | |
| 2012/0269356 A1 | 10/2012 | Sheerin et al. | |
| 2012/0275613 A1 | 11/2012 | Soulodre et al. | |
| 2012/0283593 A1 | 11/2012 | Searchfield et al. | |
| 2012/0288124 A1 | 11/2012 | Fejzo et al. | |
| 2013/0010970 A1 | 1/2013 | Hegarty et al. | |
| 2013/0028443 A1 | 1/2013 | Pance et al. | |
| 2013/0051572 A1 | 2/2013 | Goh et al. | |
| 2013/0066453 A1 | 3/2013 | Seefeldt | |
| 2013/0108055 A1 | 5/2013 | Hanna et al. | |
| 2013/0129102 A1 | 5/2013 | Li et al. | |
| 2013/0129122 A1 | 5/2013 | Johnson et al. | |
| 2013/0166227 A1 | 6/2013 | Hermann et al. | |
| 2013/0170647 A1 | 7/2013 | Reilly et al. | |
| 2013/0202131 A1 | 8/2013 | Kemmochi et al. | |
| 2013/0211843 A1 | 8/2013 | Clarkson | |
| 2013/0216071 A1 | 8/2013 | Maher et al. | |
| 2013/0223642 A1 | 8/2013 | Warren et al. | |
| 2013/0230175 A1 | 9/2013 | Bech et al. | |
| 2013/0259254 A1 | 10/2013 | Xiang et al. | |
| 2013/0279706 A1 | 10/2013 | Marti et al. | |
| 2013/0305152 A1 | 11/2013 | Griffiths et al. | |
| 2013/0315405 A1 | 11/2013 | Kanishima et al. | |
| 2013/0329896 A1 | 12/2013 | Krishnaswamy et al. | |
| 2013/0331970 A1 | 12/2013 | Beckhardt et al. | |
| 2014/0003611 A1 | 1/2014 | Mohammad et al. | |
| 2014/0003622 A1 | 1/2014 | Ikizyan et al. | |
| 2014/0003623 A1 | 1/2014 | Lang | |
| 2014/0003625 A1* | 1/2014 | Sheen | H03G 5/005 381/103 |
| 2014/0003626 A1 | 1/2014 | Holman et al. | |
| 2014/0003635 A1* | 1/2014 | Mohammad | G10K 11/16 381/306 |
| 2014/0016784 A1 | 1/2014 | Sen et al. | |
| 2014/0016786 A1 | 1/2014 | Sen | |
| 2014/0016802 A1 | 1/2014 | Sen | |
| 2014/0023196 A1 | 1/2014 | Xiang et al. | |
| 2014/0029201 A1 | 1/2014 | Yang et al. | |
| 2014/0032709 A1 | 1/2014 | Saussy et al. | |
| 2014/0037097 A1* | 2/2014 | LaBosco | H04R 29/001 381/59 |
| 2014/0037107 A1 | 2/2014 | Marino, Jr. et al. | |
| 2014/0052770 A1 | 2/2014 | Gran et al. | |
| 2014/0064501 A1 | 3/2014 | Olsen et al. | |
| 2014/0079242 A1 | 3/2014 | Nguyen et al. | |
| 2014/0084014 A1 | 3/2014 | Sim et al. | |
| 2014/0086423 A1 | 3/2014 | Domingo et al. | |
| 2014/0112481 A1 | 4/2014 | Li et al. | |
| 2014/0119551 A1 | 5/2014 | Bharitkar et al. | |
| 2014/0126730 A1 | 5/2014 | Crawley et al. | |
| 2014/0161265 A1* | 6/2014 | Chaikin | H04R 29/008 381/59 |
| 2014/0169569 A1 | 6/2014 | Toivanen et al. | |
| 2014/0180684 A1 | 6/2014 | Strub | |
| 2014/0192986 A1 | 7/2014 | Lee et al. | |
| 2014/0219456 A1 | 8/2014 | Morrell et al. | |
| 2014/0219483 A1 | 8/2014 | Hong | |
| 2014/0226823 A1 | 8/2014 | Sen et al. | |
| 2014/0242913 A1 | 8/2014 | Pang | |
| 2014/0267148 A1 | 9/2014 | Luna et al. | |
| 2014/0270202 A1 | 9/2014 | Ivanov et al. | |
| 2014/0270282 A1* | 9/2014 | Tammi | H04R 5/02 381/300 |
| 2014/0273859 A1 | 9/2014 | Luna et al. | |
| 2014/0279889 A1 | 9/2014 | Luna et al. | |
| 2014/0285313 A1 | 9/2014 | Luna et al. | |
| 2014/0286496 A1 | 9/2014 | Luna et al. | |
| 2014/0294200 A1 | 10/2014 | Baumgarte et al. | |
| 2014/0294201 A1 | 10/2014 | Johnson et al. | |
| 2014/0310269 A1 | 10/2014 | Zhang et al. | |
| 2014/0321670 A1 | 10/2014 | Nystrom et al. | |
| 2014/0323036 A1 | 10/2014 | Daley et al. | |
| 2014/0334644 A1 | 11/2014 | Selig et al. | |
| 2014/0341399 A1 | 11/2014 | Dusse | |
| 2014/0344689 A1 | 11/2014 | Scott et al. | |
| 2014/0355768 A1 | 12/2014 | Sen et al. | |
| 2014/0355794 A1 | 12/2014 | Morrell et al. | |
| 2015/0011195 A1 | 1/2015 | Li | |
| 2015/0016642 A1* | 1/2015 | Walsh | H04S 7/301 381/307 |
| 2015/0023509 A1 | 1/2015 | Devantier et al. | |
| 2015/0031287 A1 | 1/2015 | Pang et al. | |
| 2015/0032844 A1 | 1/2015 | Tarr et al. | |
| 2015/0036847 A1 | 2/2015 | Donaldson | |
| 2015/0036848 A1 | 2/2015 | Donaldson | |
| 2015/0043736 A1 | 2/2015 | Olsen et al. | |
| 2015/0063610 A1 | 3/2015 | Mossner | |
| 2015/0078586 A1 | 3/2015 | Ang et al. | |
| 2015/0078596 A1 | 3/2015 | Sprogis et al. | |
| 2015/0100991 A1 | 4/2015 | Risberg et al. | |

(56) References Cited

U.S. PATENT DOCUMENTS

| | | | |
|---|---|---|---|
| 2015/0146886 A1 | 5/2015 | Baumgarte | |
| 2015/0149943 A1 | 5/2015 | Nguyen et al. | |
| 2015/0161360 A1 | 6/2015 | Paruchuri et al. | |
| 2015/0195666 A1 | 7/2015 | Massey et al. | |
| 2015/0201274 A1 | 7/2015 | Ellner et al. | |
| 2015/0208184 A1* | 7/2015 | Tan | H04R 29/00 381/58 |
| 2015/0220558 A1 | 8/2015 | Snibbe et al. | |
| 2015/0223002 A1 | 8/2015 | Mehta et al. | |
| 2015/0229699 A1 | 8/2015 | Liu | |
| 2015/0260754 A1 | 9/2015 | Perotti et al. | |
| 2015/0271616 A1 | 9/2015 | Kechichian et al. | |
| 2015/0281866 A1 | 10/2015 | Williams et al. | |
| 2015/0289064 A1 | 10/2015 | Jensen et al. | |
| 2015/0358756 A1 | 12/2015 | Harma et al. | |
| 2015/0382128 A1* | 12/2015 | Ridihalgh | H04S 7/301 381/57 |
| 2016/0007116 A1 | 1/2016 | Holman | |
| 2016/0011850 A1 | 1/2016 | Sheen et al. | |
| 2016/0014509 A1 | 1/2016 | Hansson et al. | |
| 2016/0014536 A1 | 1/2016 | Sheen | |
| 2016/0021458 A1 | 1/2016 | Johnson et al. | |
| 2016/0021473 A1 | 1/2016 | Riggi et al. | |
| 2016/0021481 A1 | 1/2016 | Johnson et al. | |
| 2016/0027467 A1 | 1/2016 | Proud | |
| 2016/0029142 A1 | 1/2016 | Isaac et al. | |
| 2016/0035337 A1 | 2/2016 | Aggarwal | |
| 2016/0036881 A1 | 2/2016 | Tembey et al. | |
| 2016/0037277 A1 | 2/2016 | Matsumoto et al. | |
| 2016/0061597 A1 | 3/2016 | De et al. | |
| 2016/0073210 A1* | 3/2016 | Sheen | H04R 27/00 381/59 |
| 2016/0088438 A1 | 3/2016 | O'Keeffe | |
| 2016/0119730 A1 | 4/2016 | Virtanen | |
| 2016/0140969 A1 | 5/2016 | Srinivasan | |
| 2016/0165297 A1 | 6/2016 | Jamal-Syed et al. | |
| 2016/0192098 A1 | 6/2016 | Oishi et al. | |
| 2016/0192099 A1 | 6/2016 | Oishi et al. | |
| 2016/0212535 A1 | 7/2016 | Le et al. | |
| 2016/0239255 A1 | 8/2016 | Chavez et al. | |
| 2016/0254696 A1 | 9/2016 | Plumb et al. | |
| 2016/0260140 A1 | 9/2016 | Shirley et al. | |
| 2016/0309276 A1 | 10/2016 | Ridihalgh et al. | |
| 2016/0330562 A1 | 11/2016 | Crockett | |
| 2016/0366517 A1 | 12/2016 | Chandran et al. | |
| 2017/0069338 A1 | 3/2017 | Elliot et al. | |
| 2017/0083279 A1 | 3/2017 | Sheen | |
| 2017/0086003 A1 | 3/2017 | Rabinowitz et al. | |
| 2017/0105084 A1 | 4/2017 | Holman | |
| 2017/0142532 A1 | 5/2017 | Pan | |
| 2017/0207762 A1 | 7/2017 | Porter et al. | |
| 2017/0223447 A1 | 8/2017 | Johnson et al. | |
| 2017/0230772 A1 | 8/2017 | Johnson et al. | |
| 2017/0257722 A1 | 9/2017 | Kerdranvat et al. | |
| 2017/0280265 A1 | 9/2017 | Po | |
| 2017/0303039 A1 | 10/2017 | Iyer et al. | |
| 2017/0311108 A1 | 10/2017 | Patel | |
| 2017/0374482 A1 | 12/2017 | McPherson et al. | |
| 2018/0122378 A1 | 5/2018 | Mixter et al. | |
| 2019/0037328 A1 | 1/2019 | McPherson et al. | |

FOREIGN PATENT DOCUMENTS

| | | |
|---|---|---|
| CN | 101366177 A | 2/2009 |
| CN | 101491116 A | 7/2009 |
| CN | 101681219 A | 3/2010 |
| CN | 102318325 A | 1/2012 |
| CN | 102893633 A | 1/2013 |
| CN | 103491397 A | 1/2014 |
| CN | 103988523 A | 8/2014 |
| CN | 104284291 A | 1/2015 |
| CN | 105163221 A | 12/2015 |
| EP | 0505949 A1 | 9/1992 |
| EP | 0772374 A2 | 5/1997 |
| EP | 1133896 B1 | 8/2002 |
| EP | 1349427 A2 | 10/2003 |
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2197220 A2 | 6/2010 |
| EP | 2429155 A1 | 3/2012 |
| EP | 1825713 B1 | 10/2012 |
| EP | 2613573 A1 | 7/2013 |
| EP | 2591617 B1 | 6/2014 |
| EP | 2835989 A2 | 2/2015 |
| EP | 2860992 A1 | 4/2015 |
| EP | 2874413 A1 | 5/2015 |
| EP | 3128767 A2 | 2/2017 |
| EP | 2974382 B1 | 4/2017 |
| JP | H02280199 A | 11/1990 |
| JP | H05199593 A | 8/1993 |
| JP | H05211700 A | 8/1993 |
| JP | H06327089 A | 11/1994 |
| JP | H0723490 A | 1/1995 |
| JP | H1069280 A | 3/1998 |
| JP | 2002502193 A | 1/2002 |
| JP | 2003143252 A | 5/2003 |
| JP | 2003304590 A | 10/2003 |
| JP | 2005086686 A | 3/2005 |
| JP | 2005538633 A | 12/2005 |
| JP | 2006017893 A | 1/2006 |
| JP | 2006180039 A | 7/2006 |
| JP | 2007068125 A | 3/2007 |
| JP | 2007271802 A | 10/2007 |
| JP | 2008228133 A | 9/2008 |
| JP | 2009188474 A | 8/2009 |
| JP | 2010081124 A | 4/2010 |
| JP | 2010141892 A | 6/2010 |
| JP | 2011123376 A | 6/2011 |
| JP | 2011130212 A | 6/2011 |
| JP | 2011164166 A | 8/2011 |
| JP | 2011217068 A | 10/2011 |
| JP | 2013253884 A | 12/2013 |
| KR | 1020060116383 | 11/2006 |
| KR | 1020080011831 | 2/2008 |
| WO | 200153994 | 7/2001 |
| WO | 0182650 A2 | 11/2001 |
| WO | 200182650 | 11/2001 |
| WO | 2003093950 A2 | 11/2003 |
| WO | 2004066673 A1 | 8/2004 |
| WO | 2007016465 A2 | 2/2007 |
| WO | 2011139502 A1 | 11/2011 |
| WO | 2013016500 A1 | 1/2013 |
| WO | 2014032709 | 3/2014 |
| WO | 2014032709 A1 | 3/2014 |
| WO | 2014036121 A1 | 3/2014 |
| WO | 2015024881 A1 | 2/2015 |
| WO | 2015108794 A1 | 7/2015 |
| WO | 2015178950 A1 | 11/2015 |
| WO | 2016040324 A1 | 3/2016 |
| WO | 2017049169 A1 | 3/2017 |

OTHER PUBLICATIONS

Advisory Action dated Jul. 10, 2018, issued in connection with U.S. Appl. No. 15/056,553, filed Feb. 29, 2016, 3 pages.
Advisory Action dated Jul. 12, 2018, issued in connection with U.S. Appl. No. 15/166,241, filed May 26, 2016, 3 pages.
Advisory Action dated Jul. 12, 2018, issued in connection with U.S. Appl. No. 15/235,598, filed Aug. 12, 2016, 3 pages.
Advisory Action dated Aug. 16, 2017, issued in connection with U.S. Appl. No. 14/481,505, filed Sep. 9, 2014, 3 pages.
Advisory Action dated Jun. 19, 2018, issued in connection with U.S. Appl. No. 15/229,693, filed Aug. 5, 2016, 3 pages.
Advisory Action dated Sep. 19, 2017, issued in connection with U.S. Appl. No. 14/726,921, filed Jun. 1, 2015, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 1, 2017, 3 pages.

(56) References Cited

OTHER PUBLICATIONS

An Overview of IEEE 1451.4 Transducer Electronic Data Sheets (TEDS) National Instruments, 19 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, Retrieved Oct. 10, 2014, 3 pages.
Chinese Patent Office, First Office Action and Translation dated Jun. 19, 2019, issued in connection with Chinese Application No. 201680054189.X, 11 pages.
Chinese Patent Office, First Office Action dated Aug. 11, 2017, issued in connection with Chinese Patent Application No. 201580013837.2, 8 pages.
Chinese Patent Office, First Office Action dated Nov. 20, 2018, issued in connection with Chinese Application No. 201580047998.3, 21 pages.
Chinese Patent Office, First Office Action dated Sep. 25, 2017, issued in connection with Chinese Patent Application No. 201580013894.0, 9 pages.
Chinese Patent Office, First Office Action dated Nov. 5, 2018, issued in connection with Chinese Application No. 201680044080.8, 5 pages.
Chinese Patent Office, Office Action dated Nov. 14, 2019, issued in connection with Chinese Application No. 201680040086.8, 9 pages.
Chinese Patent Office, Second Office Action and Translation dated Aug. 26, 2019, issued in connection with Chinese Application No. 201580047998.3, 25 pages.
Chinese Patent Office, Second Office Action dated Jan. 11, 2019, issued in connection with Chinese Application No. 201680044080.8, 4 pages.
Chinese Patent Office, Second Office Action dated Feb. 3, 2019, issued in connection with Chinese Application No. 201580048594.6, 11 pages.
Chinese Patent Office, Second Office Action with Translation dated Jan. 9, 2018, issued in connection with Chinese Patent Application No. 201580013837.2, 10 pages.
Chinese Patent Office, Third Office Action dated Apr. 11, 2019, issued in connection with Chinese Application No. 201580048594.6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Corrected Notice of Allowability dated Jan. 19, 2017, issued in connection with U.S. Appl. No. 14/826873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Examination Report dated May 11, 2018, issued in connection with European Application No. 16748186.0, 6 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connection with European Application No. 17000460.0, 8 pages.
European Patent Office, European Office Action dated Dec. 11, 2018, issued in connection with European Application No. 15778787.0, 6 pages.
European Patent Office, European Office Action dated Jul. 11, 2019, issued in connection with European Application No. 15778787.0, 10 pages.
European Patent Office, European Office Action dated Nov. 2, 2018, issued in connection with European Application No. 18171206.8, 6 pages.
European Patent Office, European Office Action dated Feb. 4, 2019, issued in connection with European Application No. 17703876.7, 9 pages.
European Patent Office, European Office Action dated May 9, 2019, issued in connection with European Application No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450.3, 11 pages.
European Patent Office, European Search Report dated Sep. 13, 2019, issued in connection with European Application No. 19161826.3, 13 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
European Patent Office, Extended European Search Report dated Jan. 5, 2017, issued in connection with European Patent Application No. 15765555.6, 8 pages.
Non-Final Office Action dated Jul. 8, 2016, issued in connection with U.S. Appl. No. 15/066,072, filed Mar. 20, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Dec. 11, 2019, issued in connection with U.S. Appl. No. 16/556,297, filed Aug. 30, 2019, 9 pages.
Non-Final Office Action dated Dec. 11, 2019, issued in connection with U.S. Appl. No. 16/658,896, filed Oct. 21, 2019, 14 pages.
Non-Final Office Action dated Oct. 11, 2017, issued in connection with U.S. Appl. No. 15/480,265, filed Apr. 5, 2017, 8 pages.
Non-Final Office Action dated Oct. 11, 2018, issued in connection with U.S. Appl. No. 15/856791, filed Dec. 28, 2017, 13 pages.
Non-Final Office Action dated Sep. 12, 2016, issued in connection with U.S. Appl. No. 14/811,587, filed Jul. 28, 2015, 24 pages.
Non-Final Office Action dated Jul. 13, 2015, issued in connection with U.S. Appl. No. 14/940,779, filed Nov. 13, 2015, 16 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/095,827, filed Apr. 12, 2016, 12 pages.
Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.

(56) References Cited

OTHER PUBLICATIONS

Non-Final Office Action dated May 15, 2018, issued in connection with U.S. Appl. No. 15/806,126, filed Nov. 7, 2017, 17 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
Non-Final Office Action dated Jun. 20, 2017, issued in connection with U.S. Appl. No. 15/207,682, filed Jul. 12, 2016, 7 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Oct. 22, 2019, issued in connection with U.S. Appl. No. 16/416,619, filed May 20, 2019, 12 pages.
Non-Final Office Action mailed on Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.
Non-Final Office Action dated Jul. 28, 2016, issued in connection with U.S. Appl. No. 14/884,001, filed Oct. 15, 2015, 8 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.
Non-Final Office Action dated Sep. 28, 2018, issued in connection with U.S. Appl. No. 15/595,519, filed May 15, 2017, 12 pages.
Non-Final Office Action dated Mar. 29, 2018, issued in connection with U.S. Appl. No. 15/716,313, filed Sep. 26, 2017, 16 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 8, 2018, 8 pages.
Notice of Allowance dated Mar. 5, 2019, issued in connection with U.S. Appl. No. 16/102,499, filed Aug. 13, 2018, 8 pages.
Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018, 10 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated May 8, 2018, issued in connection with U.S. Appl. No. 15/650,386, filed Jul. 14, 2017, 3 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of Ihe Acoustical Society of America, American Institute of Physics for the Acoustical Society of America, New York, NY vol. 122, No. 2, Jul. 19, 2007, pp. 44-49.
Pre-Brief Appeal Conference Decision dated Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
PRISMIQ, Inc., "PRISMIQ Media Player User Guide," 2003, 44 pages.
Ross, Alex, "Wizards of Sound: Retouching acoustics, from the restaurant to the concert hall," the New Yorker, Feb 23, 2015. Web. Feb 26, 2015, 9 pages.
Supplemental Notice of Allowability dated Oct. 27, 2016, issued in connection with U.S. Appl. No. 14/481,511, filed Sep. 9, 2014, 6 pages.
United States Patent and Trademark Office, U.S. Appl. No. 60/490,768 filed on Jul. 28, 2003, entitled "Method for synchronizing audio playback between multiple networked devices," 13 pages.
United States Patent and Trademark Office, U.S. Appl. No. 60/825,407 filed on Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Wikipedia, Server(Computing) https://web.archive.org/web/20160703173710/https://en.wikipedia.org/wiki/Server_ (computing), published Jul. 3, 2016, 7 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; copyright 2004, 507 pages.
Non-Final Office Action dated Aug. 30, 2019, issued in connection with U.S. Appl. No. 16/115,525, filed Aug. 28, 2018, 13 pages.
Non-Final Office Action dated May 30, 2017, issued in connection with U.S. Appl. No. 15/478,770, filed Apr. 4, 2017, 9 pages.
Non-Final Office Action dated May 31, 2019, issued in connection with U.S. Appl. No. 16/185,906, filed Nov. 9, 2018, 7 pages.

(56) References Cited

OTHER PUBLICATIONS

Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
Non-Final Office Action dated Feb. 7, 2019, issued in connection with U.S. Appl. No. 15/865,221, filed Jan. 8, 2018, 10 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.
Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Jun. 6, 2018, issued in connection with U.S. Appl. No. 15/727,913, filed Oct. 9, 2017, 5 pages.
Notice of Allowance dated Dec. 7, 2015, issued in connection with U.S. Appl. No. 14/216,325, filed Mar. 17, 2014, 7 pages.
Notice of Allowance dated Nov. 9, 2016, issued in connection with U.S. Appl. No. 14/805,340, filed Jul. 21, 2015, 13 pages.
Notice of Allowance dated Feb. 1, 2018, issued in connection with U.S. Appl. No. 15/480,265, filed Apr. 5, 2017, 8 pages.
Notice of Allowance dated Apr. 10, 2015, issued in connection with U.S. Appl. No. 13/536,493, filed Jun. 28, 2012, 8 pages.
Notice of Allowance dated Aug. 10, 2018, issued in connection with U.S. Appl. No. 15/785,088, filed Oct. 16, 2017, 6 pages.
Notice of Allowance dated Jul. 10, 2018, issued in connection with U.S. Appl. No. 15/673,170, filed Aug. 9, 2017, 2 pages.
Notice of Allowance dated Dec. 11, 2018, issued in connection with U.S. Appl. No. 15/909,327, filed Mar. 1, 2018, 10 pages.
Notice of Allowance dated Feb. 11, 2019, issued in connection with U.S. Appl. No. 15/588,186, filed May 5, 2017, 5 pages.
Notice of Allowance dated Jul. 11, 2017, issued in connection with U.S. Appl. No. 14/678,248, filed Apr. 3, 2015, 11 pages.
Notice of Allowance dated Mar. 11, 2015, issued in connection with U.S. Appl. No. 13/340,126, filed Dec. 29, 2011, 7 pages.
Notice of Allowance dated Apr. 12, 2016, issued in connection with U.S. Appl. No. 14/681,465, filed Apr. 8, 2015, 13 pages.
Notice of Allowance dated Aug. 12, 2019, issued in connection with U.S. Appl. No. 16/416,648, filed May 20, 2019, 7 pages.
Notice of Allowance dated Dec. 12, 2016, issued in connection with U.S. Appl. No. 14/805,140, filed Jul. 21, 2015, 24 pages.
Notice of Allowance dated Dec. 12, 2017, issued in connection with U.S. Appl. No. 14/481,505, filed Sep. 9, 2014, 9 pages.
Notice of Allowance dated Nov. 12, 2019, issued in connection with U.S. Appl. No. 15/955,545, filed Apr. 17, 2018, 9 pages.
Notice of Allowance dated Sep. 12, 2016, issued in connection with U.S. Appl. No. 15/066,072, filed Mar. 10, 2016, 7 pages.
Notice of Allowance dated Sep. 12, 2017, issued in connection with U.S. Appl. No. 15/207,682, filed Jul. 12, 2016, 8 pages.
Notice of Allowance dated Feb. 13, 2017, issued in connection with U.S. Appl. No. 14/864,506, filed Sep. 24, 2015, 8 pages.
Notice of Allowance dated Nov. 13, 2017, issued in connection with U.S. Appl. No. 14/726,921, filed Jun. 1, 2015, 8 pages.
Notice of Allowance dated Mar. 14, 2019, issued in connection with U.S. Appl. No. 15/343,996, filed Nov. 4, 2016, 8 pages.
Notice of Allowance dated Jan. 15, 2019, issued in connection with U.S. Appl. No. 16/115,524, filed Aug. 28, 2018, 8 pages.
Notice of Allowance dated Jun. 15, 2017, issued in connection with U.S. Appl. No. 15/096,827, filed Apr. 12, 2016, 5 pages.
Notice of Allowance dated Mar. 15, 2017, issued in connection with U.S. Appl. No. 14/826,856, filed Aug. 14, 2015, 7 pages.
Notice of Allowance dated May 15, 2019, issued in connection with U.S. Appl. No. 16/113,032, filed Aug. 27, 2018, 9 pages.
Notice of Allowance dated Oct. 15, 2018, issued in connection with U.S. Appl. No. 1/716,313, filed Sep. 26, 2017, 10 pages.
Notice of Allowance dated Jun. 16, 2017, issued in connection with U.S. Appl. No. 14/884,001, filed Oct. 15, 2015, 8 pages.
Notice of Allowance dated May 16, 2019, issued in connection with U.S. Appl. No. 16/181,213, filed Nov. 5, 2018, 10 pages.
Notice of Allowance dated Oct. 16, 2017, issued in connection with U.S. Appl. No. 15/478,770, filed Apr. 4, 2017, 10 pages.
Notice of Allowance dated Oct. 16, 2019, issued in connection with U.S. Appl. No. 16/401,981, filed May 2, 2019, 8 pages.
Notice of Allowance dated Sep. 16, 2016, issued in connection with U.S. Appl. No. 15/066,049, filed Mar. 10, 2016, 7 pages.
Notice of Allowance dated Dec. 17, 2018, issued in connection with U.S. Appl. No. 16/055,884, filed Aug. 6, 2018, 5 pages.
Notice of Allowance dated May 17, 2017, issued in connection with U.S. Appl. No. 15/339,260, filed Oct. 31, 2016, 7 pages.
Notice of Allowance dated Oct. 17, 2019, issued in connection with U.S. Appl. No. 16/542,433, filed Aug. 16, 2019, 9 pages.
Notice of Allowance dated Mar. 18, 2019, issued in connection with U.S. Appl. No. 16/056,862, filed Aug. 7, 2018, 12 pages.
Notice of Allowance dated Aug. 19, 2016, issued in connection with U.S. Appl. No. 14/644.136, filed Mar. 10, 2015, 12 pages.
Notice of Allowance dated Jun. 19, 2017, issued in connection with U.S. Appl. No. 14/793,190, filed Jul. 7, 2015, 5 pages.
Notice of Allowance dated Sep. 19, 2017, issued in connection with U.S. Appl. No. 14/793,205, filed Jul. 7, 2015, 16 pages.
International Searching Authority, International Search Report and Written Opinion dated Oct. 18, 2016, issued in connection with International Application No. PCT/US2016/043116, filed on Jul. 20, 2016, 14 pages.
International Searching Authority, International Search Report and Written Opinion dated Oct. 18, 2016, issued in connection with International Application No. PCT/US2016/043840, filed Jul. 25, 2016, 14 pages.
International Searching Authority, International Search Report and Written Opinion dated Nov. 23, 2015, issued in connection with International Application No. PCT/US2015/048942, filed Sep. 8, 2015, 14 pages.
International Searching Authority, International Search Report and Written Opinion dated Nov. 23, 2015, issued in connection with International Application No. PCT/US2015/048944, filed Sep. 8, 2015, 12 pages.
International Searching Authority, International Search Report and Written Opinion dated Nov. 23, 2016, issued in connection with International Patent Application No. PCT/US2016/052266, filed Sep. 16, 2016, 11 pages.
International Searching Authority, International Search Report and Written Opinion dated Jan. 24, 2017, issued in connection with International Application No. PCT/US2016/052264, filed Sep. 16, 2016, 17 pages.
International Searching Authority, International Search Report and Written Opinion dated Jan. 24, 2016, issued in connection with International Application No. PCT/US2016/043109, filed Jul. 20, 2016, 12 pages.
International Searching Authority, International Search Report and Written Opinion dated Sep. 25, 2017, issued in connection with International Application No. PCT/US2017/042191, filed Jul. 14, 2017, 16 pages.
International Searching Authority, International Search Report and Written Opinion dated Aug. 3, 2017, in connection with International Application No. PCT/US2017014596, 20 pages.
Japanese Patent Office, English Translation of Office Action dated May 8, 2018, issued in connection with Japanese Application No. 2017-513241, 4 pages.
Japanese Patent Office, Japanese Office Action dated Oct. 3, 2017, issued in connection with Japanese Application No. 2017-501082, 7 pages.
Japanese Patent Office, Non-Final Office Action and Translation dated Dec. 10, 2019, issued in connection with Japanese Patent Application No. 2018-213477, 8 pages.
Japanese Patent Office, Non-Final Office Action with Translation dated Apr. 25, 2017, issued in connection with Japanese Patent Application No. 2016-568888, 7 pages.

(56) References Cited

OTHER PUBLICATIONS

Japanese Patent Office, Non-Final Office Action with Translation dated Oct. 3, 2017, issued in connection with Japanese Patent Application No. 2017-501082, 3 pages.
Japanese Patent Office, Office Action dated Jun. 12, 2018, issued in connection with Japanese Application No. 2018-502729, 4 pages.
Japanese Patent Office, Office Action dated May 14, 2019, issued in connection with Japanese Patent Application No. 2018-500529, 8 pages.
Japanese Patent Office, Office Action dated Aug. 21, 2018, issued in connection with Japanese Application No. 2018-514418, 7 pages.
Japanese Patent Office, Office Action dated Jul. 24, 2018, issued in connection with Japanese Application No. 2018-514419, 5 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.
John Mark and Paul Hufnagel "What is 1451.4, what are its uses and how does it work?" IEEE Standards Association, the IEEE 1451.4 Standard for Smart Transducers, 14pages.
Jones, Stephen, "Dell Digital Audio Receiver: Digital upgrade for your analog stereo," Analog Stereo, Jun. 24, 2000 retrieved Jun. 18, 2014, 2 pages.
"auEQ for the iPhone," Mar. 25, 2015, retrieved from the internet: URL:https://web.archive.org/web20150325152629/ http://www.hotto.de/mobileapps/iphoneaueq.html [retrieved on Jun. 24, 2016], 6 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2001.
Motorola, "Simplefi, Wireless Digital Audio Receiver, Installation and User Guide," Dec. 31, 2001, 111 pages.
Mulcahy, John, "Room EQ Wizard: Room Acoustics Software," Rew, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126,filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Non-Final Office Action dated Jul. 3, 2016, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Sep. 4, 2019, issued in connection with U.S. Appl. No. 16/213,552, filed Dec. 7, 2018, 16 pages.

Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.
Non-Final Office Action dated Sep. 7, 2016, issued in connection with U.S. Appl. No. 14/826,873, filed Aug. 14, 2015, 12 pages.
European Patent Office, Extended Search Report dated Jan. 25, 2017, issued in connection with European Application No. 15765548.1, 7 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.
European Patent Office, Office Action dated Jun. 13, 2017, issued in connection with European patent application No. 17000484.0, 10 pages.
European Patent Office, Office Action dated Dec. 15, 2016, issued in connection with European Application No. 15766998.7, 7 pages.
European Patent Office, Summons to Attend Oral Proceedings dated Nov. 15, 2018, issued in connection with European Application No. 16748186.0, 57 pages.
European Patent Office, Summons to Attend Oral Proceedings dated Sep. 24, 2019, issued in connection with European Application No. 17000460.0, 5 pages.
Ex Parte Quayle Office Action dated Apr. 15, 2019, issued in connection with U.S. Appl. No. 15/235,598, filed Aug. 12, 2016, 7 pages.
Ex Parte Quayle Office Action dated Dec. 26, 2019, issued in connection with U.S. Appl. No. 16/542,418, filed Aug. 16, 2019, 7 pages.
Final Office Action dated Dec. 2, 2019, issued in connection with U.S. Appl. No. 15/005,496, filed Jan. 25, 2016, 19 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 31, 2015, 10 pages.
Final Office Action dated Jun. 13, 2017, issued in connection with U.S. Appl. No. 14/481,505, filed Sep. 8, 2014, 22 pages.
Final Office Action dated Feb. 14, 2019, issued in connection with U.S. Appl. No. 15/005,496, filed Jan. 25, 2016, 16 pages.
Final Office Action dated Feb. 14, 2019, issued in connection with U.S. Appl. No. 15/217,399, filed Jul. 22, 2016, 37 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Apr. 18, 2017, issued in connection with U.S. Appl. No. 14/678,263, filed Apr. 3, 2015, 16 pages.
Final Office Action dated Apr. 18, 2016, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Oct. 21, 2016, issued in connection with U.S. Appl. No. 14/696,014, filed Apr. 24, 2015, 13 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.

(56) References Cited

OTHER PUBLICATIONS

Final Office Action dated Oct. 28, 2019, issued in connection with U.S. Appl. No. 16/181,865, filed Nov. 6, 2018, 17 pages.
Final Office Action dated Apr. 3, 2018, issued in connection with U.S. Appl. No. 15/235,598, filed Aug. 12, 2016, 12 pages.
Final Office Action dated Feb. 5, 2018, issued in connection with U.S. Appl. No. 15/229,693, filed Aug. 5, 2016, 21 pages.
Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl, No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.
First Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability, dated Sep. 24, 2015, issued in connection with International Application No. PCT/US2014/030560, filed Mar. 17, 2014, 7 pages.
International Bureau, International Preliminary Report on Patentability dated Sep. 29, 2016, issued in connection with International Application No. PCT/US2015/020993, filed Mar. 17, 2015, 8 pages.
International Bureau, International Preliminary Report on Patentability dated Sep. 29, 2016, issued in connection with International Application No. PCT/US2015/021000, filed Mar. 17, 2015, 9 pages.
International Bureau, International Preliminary Report on Patentability, dated Aug. 9, 2018, issued in connection with International Application No. PCT/US2017/014596, filed Jan. 23, 2017, 11 pages.
International Searching Authority, International Preliminary Report on Patentability dated Mar. 23, 2017, issued in connection with International Patent Application No. PCT/US2015/048944, filed Sep. 8, 2015, 8 pages.
International Searching Authority, International Preliminary Report on Patentability dated Oct. 24, 2017, issued in connection with International Application No, PCT/US2016/028994 filed Apr. 22, 2016, 7 pages.
International Searching Authority, International Search Report and Written Opinion dated Jul. 4, 2016, issued in connection with International Application No. PCT/US2016/028994, filed Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
International Searching Authority, International Search Report and Written Opinion dated Nov. 18, 2015, issued in connection with International Application No. PCT/US2015/048954, filed on Sep. 8, 2015, 11 pages.
Notice of Allowance dated Sep. 19, 2018, issued in connection with U.S. Appl. No. 14/864,393, filed Sep. 24, 2015, 10 pages.
Notice of Allowance dated Apr. 20, 2017, issued in connection with U.S. Appl. No. 14/940,779, filed Nov. 13, 2015, 11 pages.
Notice of Allowance dated Nov. 20, 2017, issued in connection with U.S. Appl. No. 15/298,115, filed Oct. 19, 2016, 10 pages.
Notice of Allowance dated Sep. 20, 2017, issued in connection with U.S. Appl. No. 14/481,514, filed Sep. 9, 2014, 10 pages.
Notice of Allowance dated Dec. 21, 2016, issued in connection with U.S. Appl. No. 14/682,182, filed Apr. 9, 2015, 8 pages.
Notice of Allowance dated Feb. 21, 2018, issued in connection with U.S. Appl. No. 15/005,853, filed Jan. 25, 2016, 5 pages.
Notice of Allowance dated Jul. 21, 2017, issued in connection with U.S. Appl. No. 15/211,835, filed Jul. 15, 2016, 10 pages.
Notice of Allowance dated Jun. 21, 2019, issued in connection with U.S. Appl. No. 15/235,598, filed Aug. 12, 2016, 11 pages.
Notice of Allowance dated Oct. 21, 2019, issued in connection with U.S. Appl. No. 16/182,886, filed Nov. 7, 2018, 10 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Jun. 23, 2016, issued in connection with U.S. Appl. No. 14/921,781, filed Oct. 23, 2015, 8 pages.
Notice of Allowance dated May 23, 2018, issued in connection with U.S. Appl. No. 15/698,283, filed on Sep. 7, 2017, 8 pages.
Notice of Allowance dated Oct. 23, 2017, issued in connection with U.S. Appl. No. 14/481,522, filed Sep. 9, 2014, 16 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 3 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2007, 8 pages.
Notice of Allowance dated Apr. 25, 2017, issued in connection with U.S. Appl. No. 14/696,041, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 28, 2015, 9 pages.
Notice of Allowance dated Jul. 27, 2017, issued in connection with U.S. Appl. No. 15/005,853, filed Jan. 25, 2016, 5 pages.
Notice of Allowance dated June 27, 2017, issued in connection with U.S. Appl. No. 15/344,069, filed Nov. 4, 2016, 8 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2019, 9 pages.
Notice of Allowance dated Mar. 28, 2018, issued in connection with U.S. Appl. No. 15/673,170, filed Aug. 9, 2017, 5 pages.

(56) References Cited

OTHER PUBLICATIONS

Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Aug. 29, 2019, issued in connection with U.S. Appl. No. 16/185,906, filed Nov. 9, 2018, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 9, 2014, 11 pages.
Notice of Allowance dated Oct. 29, 2015, issued in connection with U.S. Appl. No. 14/216,306, filed Mar. 17, 2014, 9 pages.
Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed Nov. 6, 2018, 7 pages.
Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. App. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Apr. 4, 2017, issued in connection with U.S. Appl. No. 14/682,182, filed Apr. 9, 2015, 8 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Oct. 4, 2018, issued in connection with U.S. Appl. No. 15/166,241, filed May 26, 2016, 7 pages.
Notice of Allowance dated Apr. 5, 2018, issued in connection with U.S. Appl. No. 15/681,640, filed Aug. 21, 2017, 8 pages.

\* cited by examiner

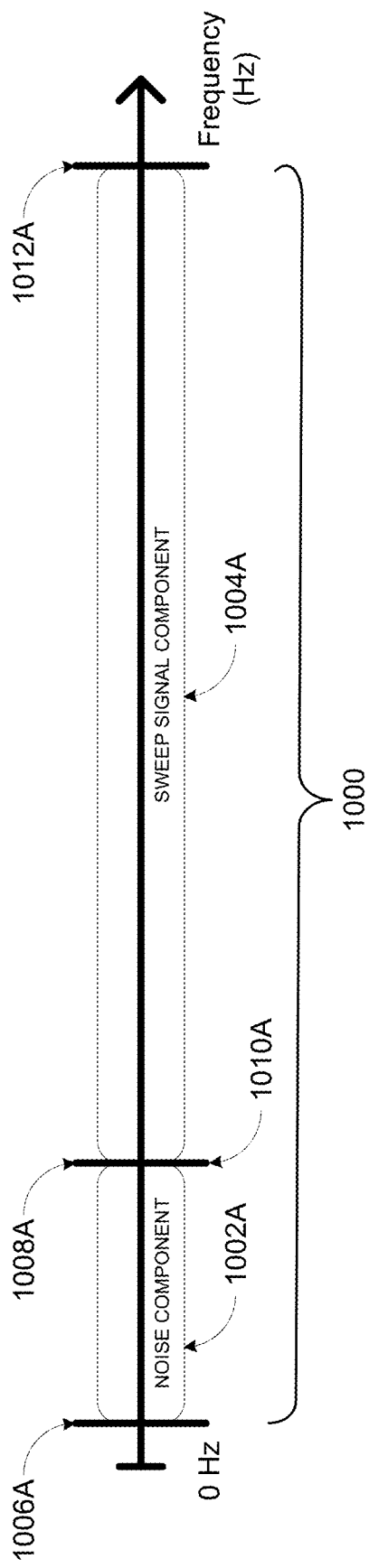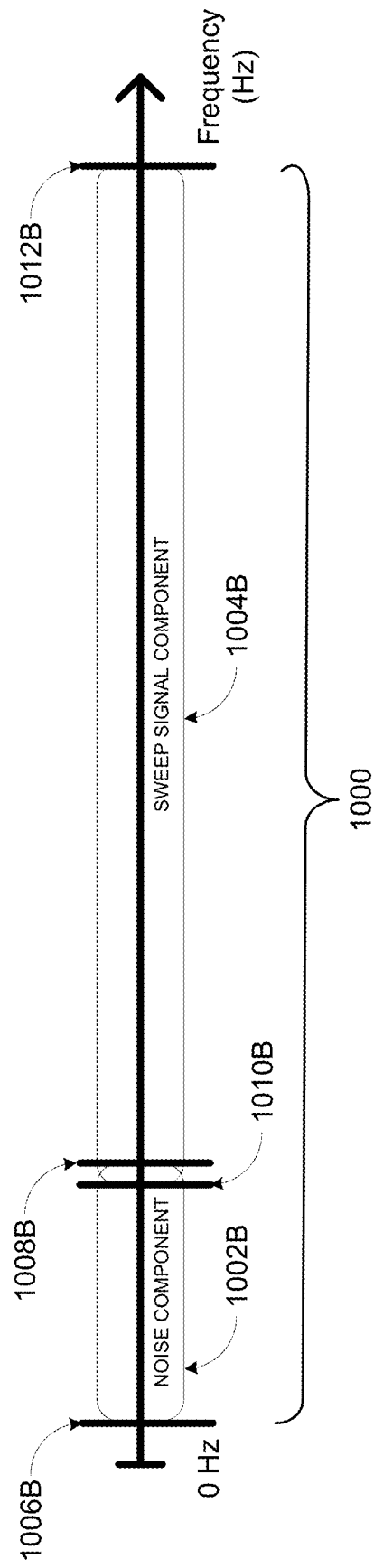
FIGURE 10A
FIGURE 10B

CONCURRENT MULTI-DRIVER CALIBRATION

CROSS REFERENCE TO RELATED APPLICATIONS

This application claims priority under 35 U.S.C. § 120 to, and is a continuation of, U.S. non-provisional patent application Ser. No. 16/181,583, filed on Nov. 6, 2018, entitled "Concurrent Multi-Loudspeaker Calibration," which is incorporated herein by reference in its entirety.

U.S. non-provisional patent application Ser. No. 16/181,583 claims priority under 35 U.S.C. § 120 to, and is a continuation of, U.S. non-provisional patent application Ser. No. 15/909,529, filed on Mar. 1, 2018, entitled "Concurrent Multi-Loudspeaker Calibration," and issued as U.S. Pat. No. 10,129,674 on Nov. 13, 2018, which is incorporated herein by reference in its entirety.

U.S. non-provisional patent application Ser. No. 15/909,529 claims priority under 35 U.S.C. § 120 to, and is a continuation of, U.S. non-provisional patent application Ser. No. 15/478,770, filed on Apr. 4, 2017, entitled "Concurrent Multi-Loudspeaker Calibration with a Single Measurement," and issued as U.S. Pat. No. 9,913,057 on Mar. 6, 2018, which is incorporated herein by reference in its entirety.

U.S. non-provisional patent application Ser. No. 15/478,770 claims priority under 35 U.S.C. § 120 to, and is a continuation of, U.S. non-provisional patent application Ser. No. 14/805,340, filed on Jul. 21, 2015, entitled "Concurrent Multi-Loudspeaker Calibration with a Single Measurement," and issued as U.S. Pat. No. 9,648,422 on May 9, 2017, which is also incorporated herein by reference in its entirety.

This application is related to U.S. patent application Ser. No. 13/536,493 filed Jun. 28, 2012, entitled "System and Method for Device Playback Calibration," and U.S. patent application Ser. No. 14/805,140 filed Jul. 21, 2015, entitled "Hybrid Test Tone for Space Averaged Room Audio Calibration Using A Moving Microphone," which are both incorporated herein in their entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIGS. 10A and 10B illustrate transition frequency ranges of example hybrid calibration sounds;

Figure 1:
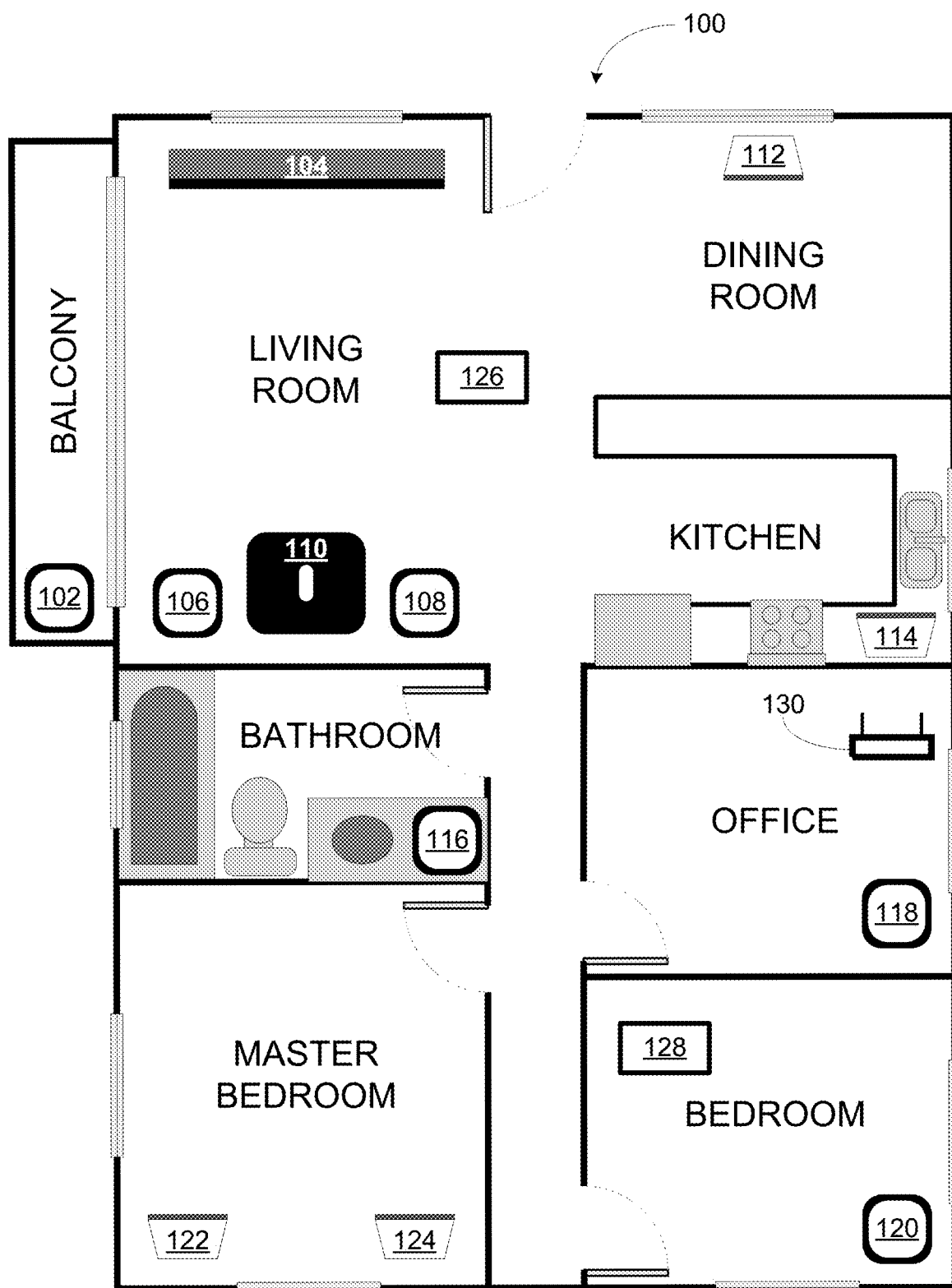
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Embodiments described herein involve, inter alia, techniques to facilitate calibration of a media playback system. Some calibration procedures contemplated herein involve a control device of the media playback system detecting and analyzing sound waves (e.g., one or more calibration sounds) which were emitted by one or more playback devices of the media playback system. In some examples, such a control device may instruct the one or more playback devices to emit a particular calibration sound that facilitates analysis and calibration.

As indicated above, example calibration procedures may involve a playback device emitting a calibration sound, which is detected and analyzed by a control device. In some embodiments, the control device may analyze the calibration sound over a range of frequencies over which the playback device is to be calibrated (i.e., a calibration range). Accordingly, the particular calibration sound that is emitted by a playback device covers the calibration frequency range. The calibration frequency range may include a range of frequencies that the playback device is capable of emitting (e.g., 15-30,000 Hz) and may be inclusive of frequencies that are considered to be in the range of human hearing (e.g., 20-20,000 Hz). By emitting and subsequently detecting a calibration sound covering such a range of frequencies, a frequency response that is inclusive of that range may be determined for the playback device. Such a frequency response may be representative of the environment in which the playback device emitted the calibration sound.

Acoustics of an environment may vary from location to location within the environment. Because of this variation, some calibration procedures may be improved by positioning the playback device to be calibrated within the environment as the playback device will later be operated. In that position, the environment may affect the calibration sound emitted by a playback device in a similar manner as playback will be affected by the environment during operation. A set-up phase of a calibration procedure may involve positioning the playback device in this position.

Some example calibration procedures may involve detecting the calibration sound at multiple physical locations within the environment, which may assist in capturing acoustic variability within the environment. To facilitate detecting the calibration sound at multiple points within an environment, some calibration procedures involve a moving microphone. For example, the microphone that is detecting the calibration sound may be continuously moved through the environment while the calibration sound is emitted. Such continuous movement may facilitate detecting the calibration sounds at multiple physical locations within the environment, which may provide a better understanding of the environment as a whole.

In some embodiments, a playback device may repeatedly emit the calibration sound during the calibration procedure such that the calibration sound covers the calibration frequency range during each repetition. With a moving microphone, repetitions of the calibration sound are continuously detected at different physical locations within the environment. For instance, the playback device might emit a periodic calibration sound. Each period of the calibration sound may be detected by the control device at a different physical location within the environment thereby providing a sample at that location. Such a calibration sound may therefore facilitate a space-averaged calibration of the environment.

Example calibration sounds may cover the calibration frequency range using various waveforms. Some example calibration procedures may implement noise (e.g., pseudorandom periodic noise) that varies over the calibration frequency range during each period. However, phase distortion caused by the microphone's movement may make correlating a detected noise signal to the emitted noise signal difficult or impossible. Other example calibration procedures may implement a swept signal (e.g., a swept-sine or chirp) that ascends or descends through the frequency range in a pre-determined pattern. A swept signal facilitates correlating the detected signal to the emitted signal, as the phase shift is predictable (as Doppler shift). However, at lower frequencies, a swept signal may overload the speaker drivers in an attempt to ensure sufficient energy to overcome background noise typically present in a given environment.

Some example calibration procedures described herein may implement a hybrid calibration sound that includes both noise and a swept signal, which may counter some of these issues. For instance, a hybrid calibration sound may include a noise component that covers low frequencies up to a first threshold (e.g., a threshold in the range of 50-100 Hz). Such a noise component may be emitted by a playback device with sufficient energy to overcome typical background noise (e.g., that of a quiet room) with a lower risk of overloading the speaker driver(s) of that playback device. The hybrid calibration sound may also include a swept signal (e.g., a swept-sine) that ascends or descends from a second threshold up to the highest frequencies of the calibration range (or above). A predictable signal, like a swept signal, facilitates the control device reversing phase distortion resulting from the microphone motion.

Since portions of the calibration frequency range may be audible to humans, some aspects of the calibration sound may be designed to make the calibration sound more pleasant to a human listener. For instance, some implementations of a hybrid calibration sound may include a transition frequency range in which the noise component and the swept component overlap. Overlapping these components may avoid possibly unpleasant sounds that are associated with a harsh transition between the two types of sounds. As another technique to make the calibration sound more pleasant, the swept portion of the calibration sound may descend (rather than ascend) through the calibration range. While either an ascending or descending swept sine may be effective for calibration, a descending signal may be more pleasant to hear because of the particular shape of the human ear canal.

In some circumstances, multiple playback devices may be calibrated during a calibration procedure. For instance, an example calibration procedure may calibrate a grouping of playback devices. Such a grouping might be a zone of a media playback system that includes multiple playback devices, or, perhaps a grouping might be formed from multiple zones of a media playback system that are grouped into a zone group that includes a respective playback device from each zone. Such groupings might be physically located within the same environment (e.g., a room of a house or other building).

In some embodiments, certain portions of the calibration procedure may be performed concurrently. For instance, multiple playback devices may emit a calibration sound concurrently. However, when two playback devices emit the same portion of the calibration sound concurrently, the concurrently emitted calibration sounds may interfere with one another, which may prevent the control device from obtaining a measurement of sufficient quality. Further, the control device might not be able to correlate a particular calibration tone to the playback device that emitted that tone because the same frequency tones are indistinguishable.

With example implementations, the calibration sounds may be tailored in an attempt to avoid such interference. For instance, a baseline calibration sound that covers the calibration frequency range (i.e., a calibration sound used to calibrate a single playback device) may be lengthened such that its duration is proportional to the number of channels to be calibrated. For instance, the calibration sound emitted during the calibration of three channels may be equal in duration to three multiples of the duration of the baseline calibration sound. Such stretching may provide sufficient time in each repetition for the channels to emit a respective calibration sound that covers the calibration frequency range without overlapping frequencies.

Further, the channels that are emitting the calibration sound may be offset (i.e., delayed) relative to one another so as to stagger the calibration sounds. Staggering the calibration sounds may prevent the channels from outputting the same portion of the calibration sound at the same time. As noted above, by emitting calibration sounds with overlapping frequencies, two playback devices can interfere with the control device detecting respective calibration sounds from each device.

Example techniques may involve emitting a hybrid calibration sound. In one aspect, a method is provided. The method may involve receiving, via a network interface, a command that instructs the playback device to emit a calibration sound and responsively causing the one or more speakers to emit a periodic calibration sound that covers a calibration frequency range, where the periodic calibration sound comprises (i) a first component that includes noise at frequencies between a minimum of the calibration frequency range and a first threshold frequency, and (ii) a second component that sweeps through frequencies between a second threshold frequency and a maximum of the calibration frequency range.

In another aspect, a device is provided. The device includes a network interface, at least one processor, a data storage, and program logic stored in the data storage and executable by the at least one processor to perform operations. The operations may include receiving, via the network interface, a command that instructs the playback device to emit a calibration sound and responsively causing the one or more speakers to emit a periodic calibration sound that covers a calibration frequency range, where the periodic calibration sound comprises (i) a first component that includes noise at frequencies between a minimum of the calibration frequency range and a first threshold frequency, and (ii) a second component that sweeps through frequencies between a second threshold frequency and a maximum of the calibration frequency range.

In yet another aspect, a non-transitory computer readable memory is provided. The non-transitory computer readable memory has stored thereon instructions executable by a computing device to cause the computing device to perform operations. The operations may include receiving, via the network interface, a command that instructs the playback device to emit a calibration sound and responsively causing the one or more speakers to emit a periodic calibration sound that covers a calibration frequency range, where the periodic calibration sound comprises (i) a first component that includes noise at frequencies between a minimum of the calibration frequency range and a first threshold frequency, and (ii) a second component that sweeps through frequencies between a second threshold frequency and a maximum of the calibration frequency range.

Further example techniques may involve multiple playback devices emitting a calibration sound. In one aspect, a method is provided. The method may involve detecting a trigger condition that initiates calibration of a plurality of playback devices. The method may also involve sending, to a first playback device of the plurality, a command that instructs the first playback device to repeatedly emit a calibration sound according to a sequence, where the calibration sound cycles through frequencies of a calibration frequency range, and where a duration of the calibration sound is proportional to the given number of playback devices in the plurality. The method may further involve sending, to one or more additional playback devices of the plurality, respective commands that instruct the one or more additional playback devices to repeatedly emit the respective calibration sound according to the sequence, where the commands instruct the one or more additional playback devices to stagger emission of the calibration sounds such that each emitted calibration sound is delayed relative to a preceding calibration sound in the sequence. The method may also involve detecting, via a microphone, the emitted calibration sounds.

In another aspect, a device is provided. The device includes a network interface, at least one processor, a data storage, and program logic stored in the data storage and executable by the at least one processor to perform operations. The operations may include detecting a trigger condition that initiates calibration of a plurality of playback devices. The operations may also include sending, to a first playback device of the plurality, a command that instructs the first playback device to repeatedly emit a calibration sound according to a sequence, where the calibration sound cycles through frequencies of a calibration frequency range, and where a duration of the calibration sound is proportional to the given number of playback devices in the plurality. The operations may further include sending, to one or more additional playback devices of the plurality, respective commands that instruct the one or more additional playback devices to repeatedly emit the respective calibration sound according to the sequence, where the commands instruct the one or more additional playback devices to stagger emission of the calibration sounds such that each emitted calibration sound is delayed relative to a preceding calibration sound in the sequence. The operations may also include detecting, via a microphone, the emitted calibration sounds.

In yet another aspect, a non-transitory computer readable memory is provided. The non-transitory computer readable memory has stored thereon instructions executable by a computing device to cause the computing device to perform operations. The operations may include detecting a trigger condition that initiates calibration of a plurality of playback devices. The operations may also include sending, to a first playback device of the plurality, a command that instructs the first playback device to repeatedly emit a calibration sound according to a sequence, where the calibration sound cycles through frequencies of a calibration frequency range, and where a duration of the calibration sound is proportional to the given number of playback devices in the plurality. The operations may further include sending, to one or more additional playback devices of the plurality, respective commands that instruct the one or more additional playback devices to repeatedly emit the respective calibration sound according to the sequence, where the commands instruct the one or more additional playback devices to stagger emission of the calibration sounds such that each emitted calibration sound is delayed relative to a preceding calibration sound in the sequence. The operations may also include detecting, via a microphone, the emitted calibration sounds.

It will be understood by one of ordinary skill in the art that this disclosure includes numerous other embodiments. It will be understood by one of ordinary skill in the art that this disclosure includes numerous other embodiments. While some examples described herein may refer to functions performed by given actors such as "users" and/or other entities, it should be understood that this description is for purposes of explanation only. The claims should not be interpreted to require action by any such example actor unless explicitly required by the language of the claims themselves.

II. Example Operating Environment

FIG. 1 illustrates an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
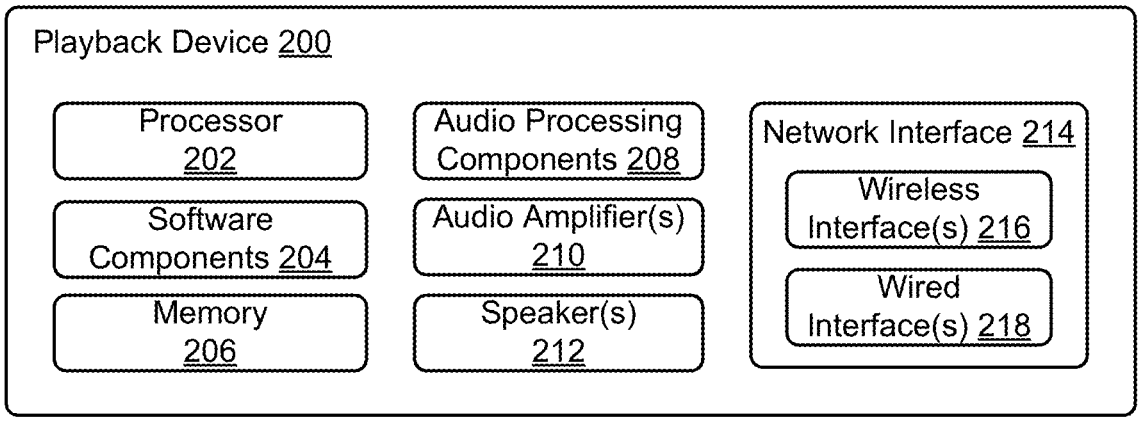
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
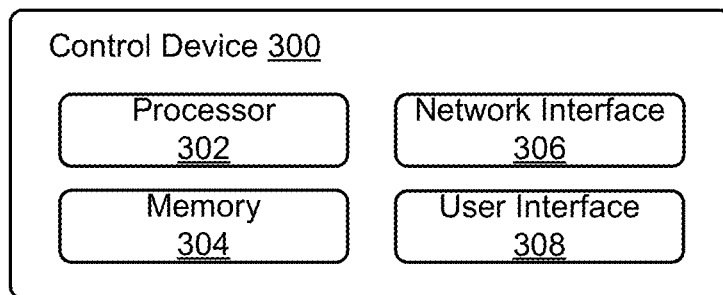
FIG. 3 shows a functional block diagram of an example control device.

FIG. 3 shows a functional block diagram of an example control device 300 that may be configured to be one or both of the control devices 126 and 128 of the media playback system 100. Control device 300 may also be referred to as a controller 300. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™ iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
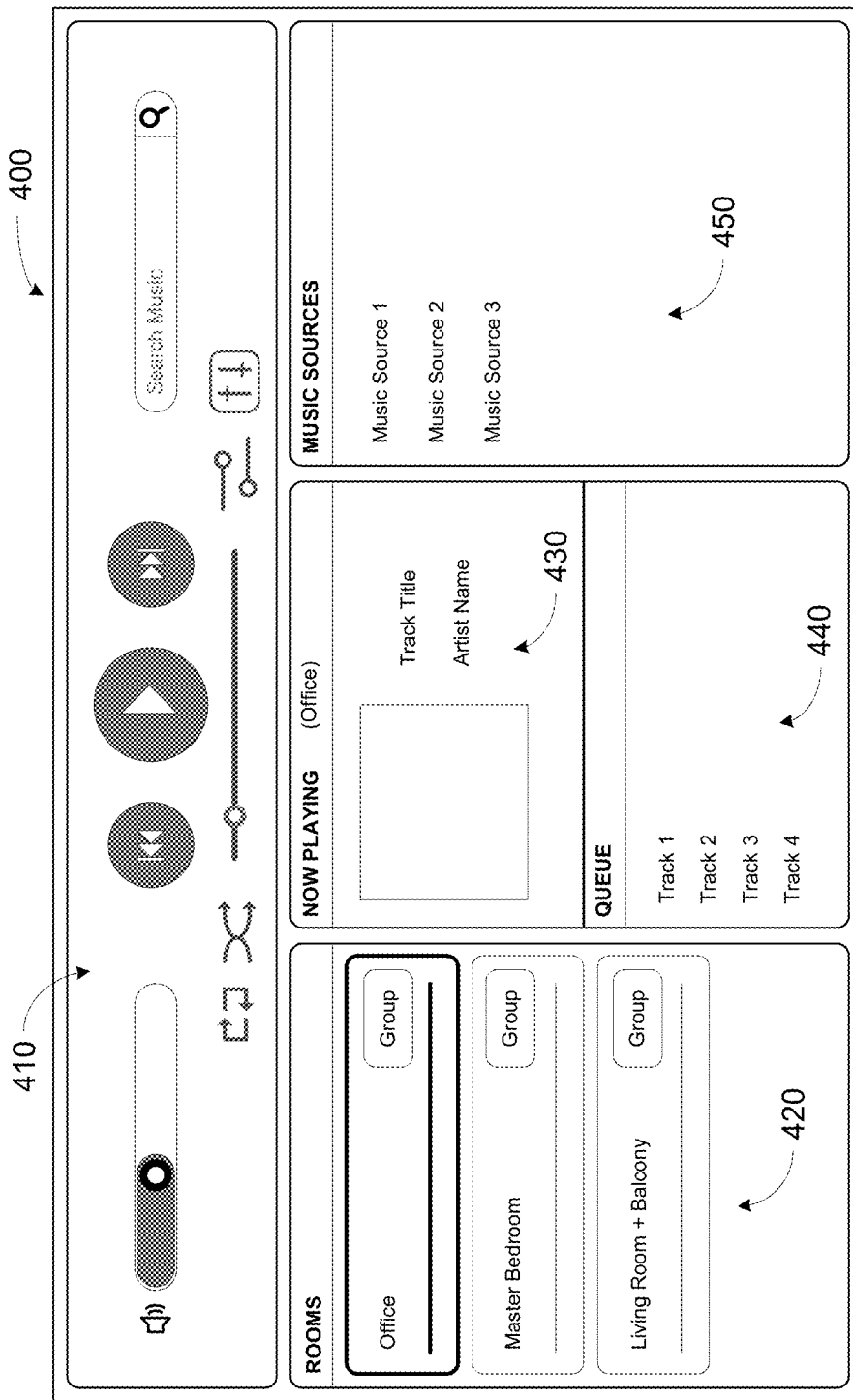
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device. Playback of such a playback queue may involve one or more playback devices playing back media items of the queue, perhaps in sequential or random order.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g., according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

Figure 5:
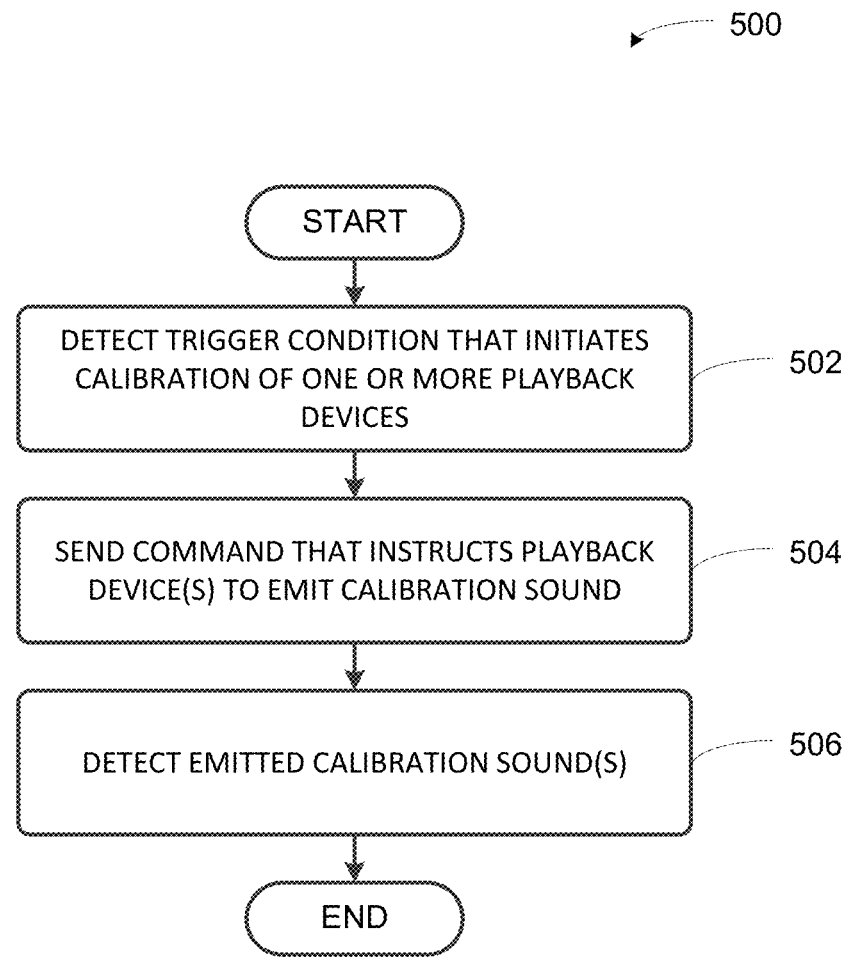
FIG. 5 shows an example flow diagram to facilitate the calibration of a playback device by causing the playback device to emit a calibration sound.
Figure 14:
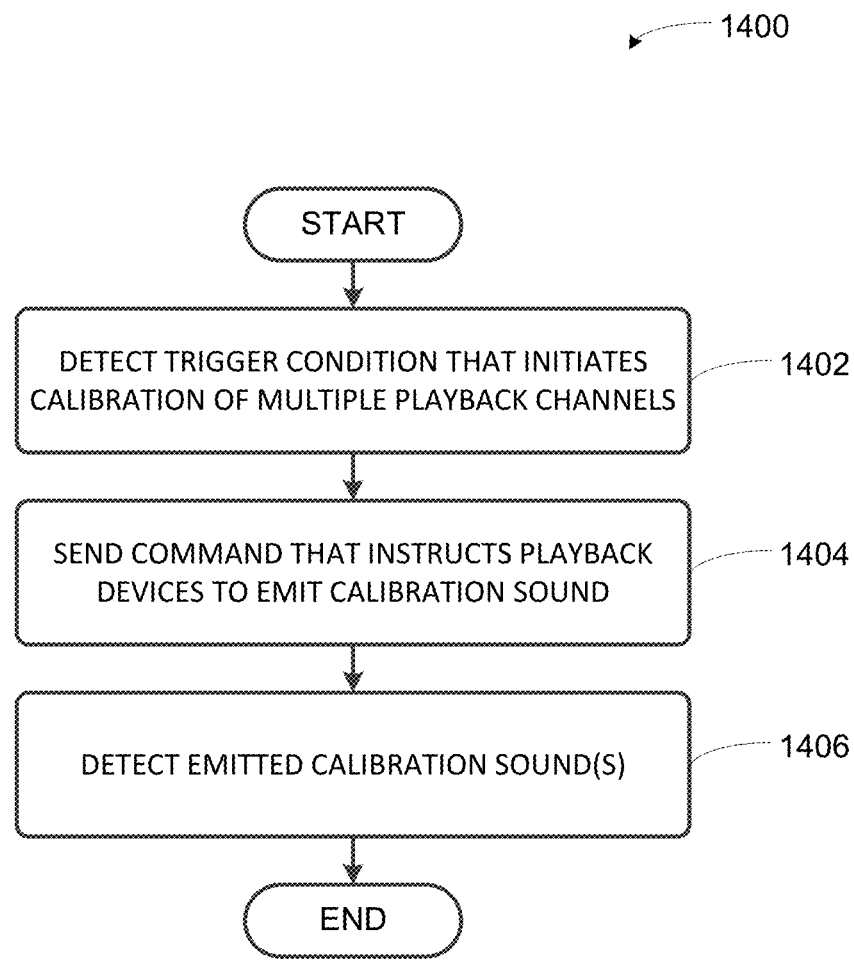
FIG. 14 shows an example flow diagram to facilitate the calibration of multiple playback devices by causing the playback devices to emit a sequence of calibration sounds.
Figure 16:
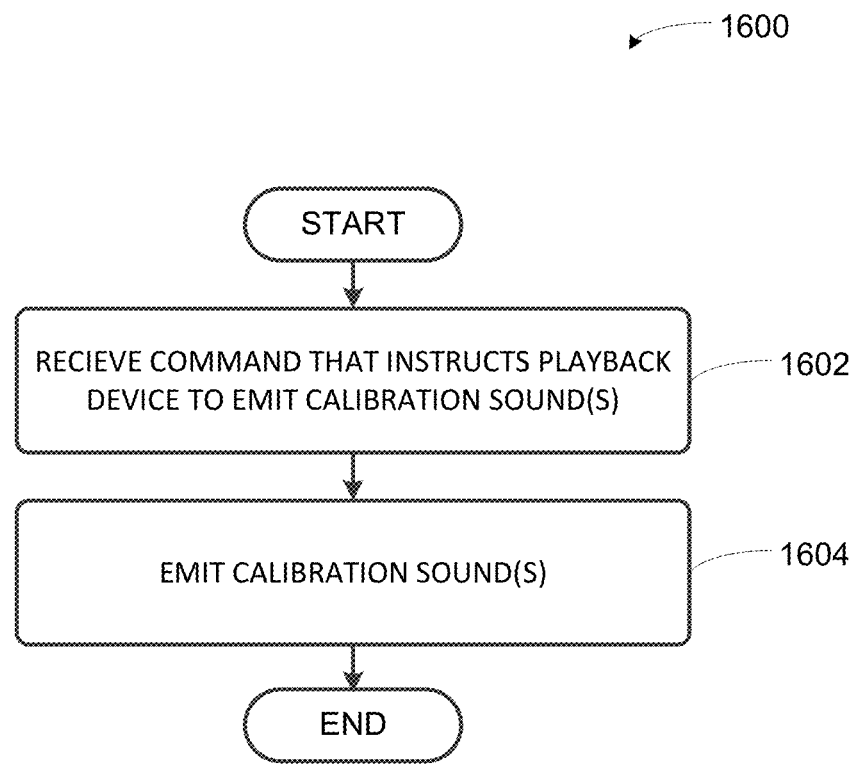
FIG. 16 shows an example flow diagram to emit a calibration sound.

Moving now to several example implementations, implementations 500, 1400, and 1600 shown in FIGS. 5, 14 and 16, respectively present example embodiments of techniques described herein. These example embodiments that can be implemented within an operating environment including, for example, the media playback system 100 of FIG. 1, one or more of the playback device 200 of FIG. 2, or one or more of the control device 300 of FIG. 3. Further, operations illustrated by way of example as being performed by a media playback system can be performed by any suitable device, such as a playback device or a control device of a media playback system. Implementations 500, 1400, and 1600 may include one or more operations, functions, or actions as illustrated by one or more of blocks shown in FIGS. 5, 14 and 16. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the implementations disclosed herein, the flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementations disclosed herein, each block may represent circuitry that is wired to perform the specific logical functions in the process.

III. Example Techniques to Facilitate Calibration of a Playback Device by Causing a Playback Device to Emit a Hybrid Calibration Sound As discussed above, embodiments described herein may facilitate the calibration of one or more playback devices. FIG. 5 illustrates an example implementation 500 to cause a playback device to emit a hybrid calibration sound.

a. Detect Trigger Condition that Initiates Calibration of at Least One Playback Device At block 502, implementation 500 involves detecting a trigger condition that initiates calibration of at least one playback device. For instance, a control device, such as control device 126 of media playback system 100, may detect a trigger condition that causes control device 126 to initiate calibration of a playback device (e.g., one of playback devices 102-124). Alternatively, a playback device of a media playback system may detect such a trigger condition (and perhaps relay an indication of that trigger condition to a control device). As noted above, calibration of a playback device may involve adjusting one or more acoustic parameters of a playback device's speakers (i.e., channels) in an attempt to improve acoustic characteristic of those speakers within a given environment.

In some embodiments, detecting the trigger condition may involve detecting input data indicating a selection of a selectable control. For instance, a control device, such as control device 126, may display an interface (e.g., control interface 400 of FIG. 4), which includes one or more controls that, when selected, initiate calibration of a playback device, or a group of playback devices (e.g., a zone).

Figure 6:
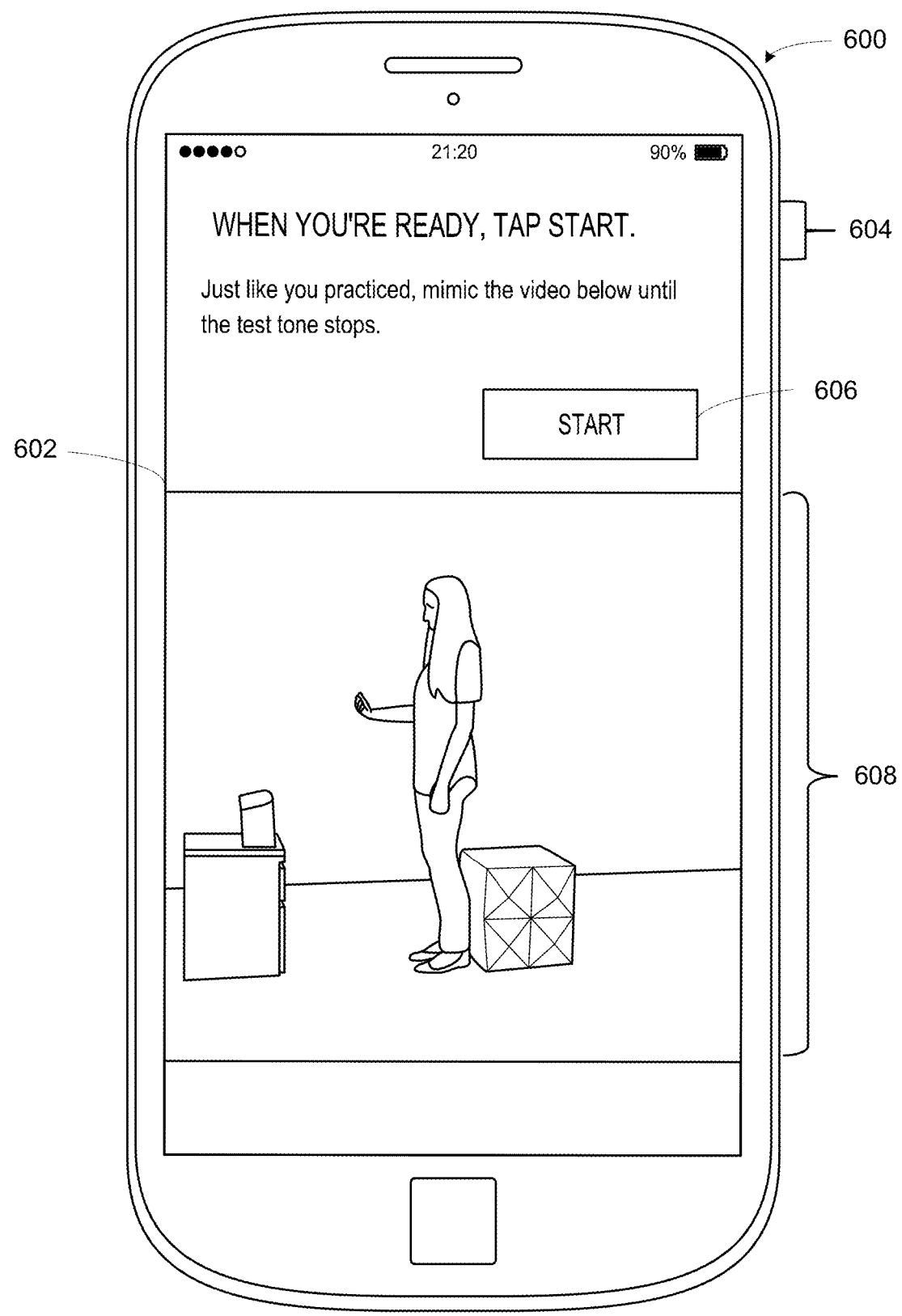
FIG. 6 shows a smartphone that is displaying an example control interface, according to an example implementation.

To illustrate such a control, FIG. 6 shows a control device 600 (e.g., a smartphone) which is displaying an example control interface 602. Control interface 602 includes a graphical region 604 that prompts to tap selectable control 606 (Start) when ready. When selected, selectable control 606 may initiate the calibration procedure. As shown, selectable control 606 is a button control. While a button control is shown by way of example, other types of controls are contemplated as well.

Control interface 602 further includes a graphical region 608 that includes a video depicting how to assist in the calibration procedure. Some calibration procedures may involve moving a microphone through an environment in order to obtain samples of the calibration sound at multiple physical locations. In order to prompt a user to move the microphone, the control device may display a video or animation depicting the step or steps to be performed during the calibration.

Figure 7:
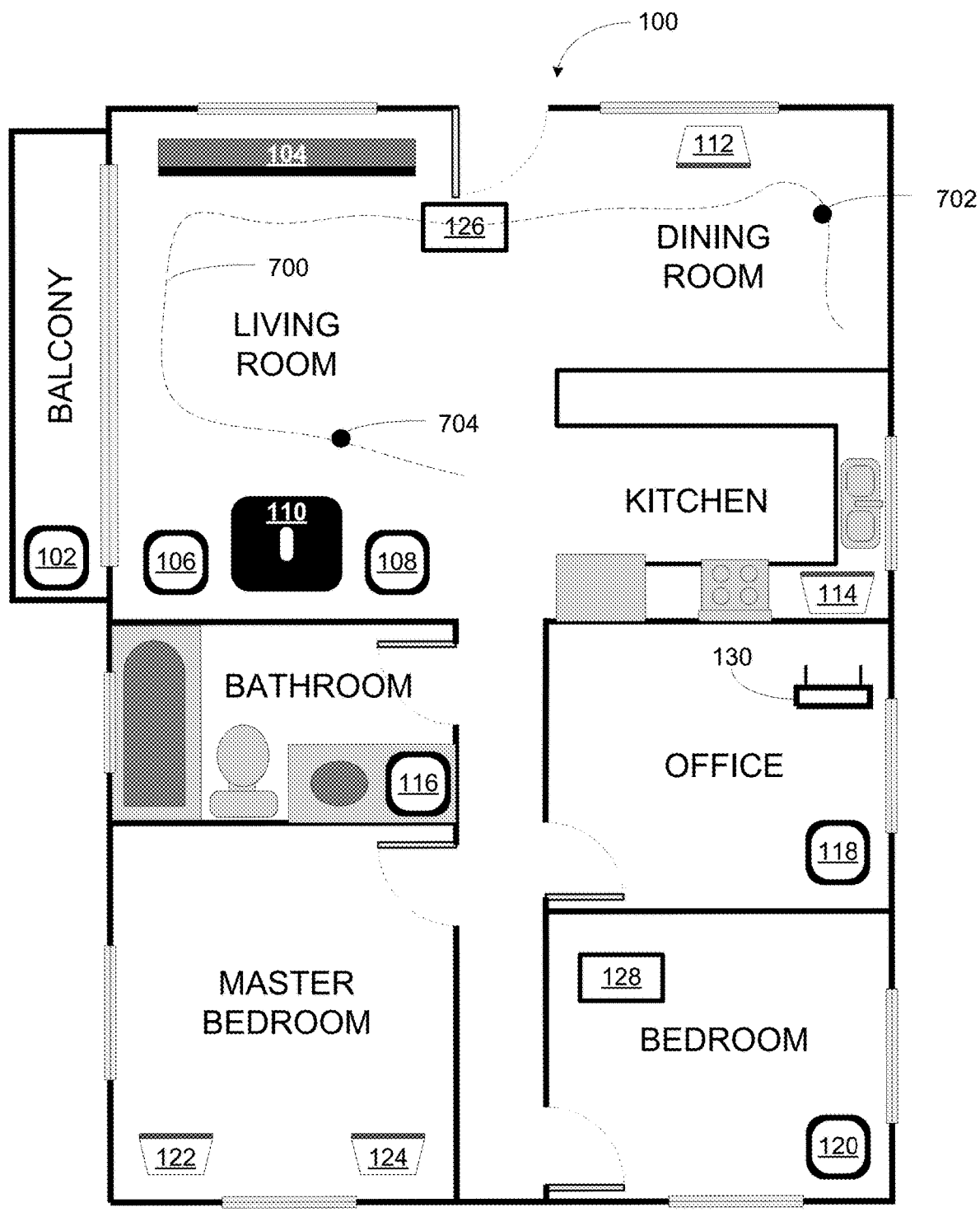
FIG. 7 illustrates an example movement through an example environment in which an example media playback system is positioned.

To illustrate movement of the control device during calibration, FIG. 7 shows media playback system 100 of FIG. 1. FIG. 7 shows a path 700 along which a control device (e.g., control device 126) might be moved during calibration. As noted above, the control device may indicate how to perform such a movement in various ways, such as by way of a video or animation, among other examples.

In other examples, detecting the trigger condition may involve a playback device detecting that the playback device has become uncalibrated, which might be caused by moving the playback device to a different position. For example, the playback device may detect physical movement via one or more sensors that are sensitive to movement (e.g., an accelerometer). As another example, the playback device may detect that it has been moved to a different zone (e.g., from a "Kitchen" zone to a "Living Room" zone), perhaps by receiving an instruction from a control device that causes the playback device to leave a first zone and join a second zone.

In further examples, detecting the trigger condition may involve a device (e.g., a control device or playback device) detecting a new playback device in the system. Such a playback device may have not yet been calibrated for the environment. For instance, a control device may detect a new playback device as part of a set-up procedure for a media playback system (e.g., a procedure to configure one or more playback devices into a media playback system). In other cases, the control device may detect a new playback device by detecting input data indicating a request to configure the media playback system (e.g., a request to configure a media playback system with an additional playback device).

b. Send Command that Instructs Playback Device(s) to Emit Calibration Sound

Referring back to FIG. 5, at block 504, implementation 500 involves sending a command that instructs the at least one playback device to emit a calibration sound. For instance, a control device, such as control device 126 of media playback system 100, may send a command that causes a playback device (e.g., one of playback devices 102-124) to emit a calibration sound. The control device may send the command via a network interface (e.g., a wired or wireless network interface). A playback device may receive such a command, perhaps via a network interface, and responsively emit the calibration sound.

The emitted calibration sound may include frequencies that cover a calibration frequency range. As noted above, a control device may analyze the calibration sound over a range of frequencies over which the playback device is to be calibrated (i.e., a calibration range). Accordingly, the command may instruct the playback device to emit a calibration sound that covers the calibration frequency range. The calibration frequency range may include a range of frequencies that the playback device is capable of emitting (e.g., 15-30,000 Hz) and may be inclusive of frequencies that are considered to be in the range of human hearing (e.g., 20-20,000 Hz). By emitting a calibration tone covering such a range of frequencies, a frequency response that is inclusive of that range may be determined for the playback device.

In some embodiments, a playback device may repeatedly emit the calibration sound during the calibration procedure such that the calibration sound covers the calibration frequency range during each repetition. With a moving microphone, repetitions of the calibration sound are detected at different physical locations within the environment, thereby providing samples that are spaced throughout the environment. In some cases, the calibration sound may be periodic calibration signal in which each period covers the calibration frequency range.

To facilitate determining a frequency response, the calibration sound should be emitted with sufficient energy at each frequency to overcome background noise. To increase the energy at a given frequency, a tone at that frequency may be emitted for a longer duration. However, by lengthening the period of the calibration sound, the spatial resolution of the calibration procedure is decreased, as the moving microphone moves further during each period (assuming a relatively constant velocity). As another technique to increase the energy at a given frequency, a playback device may increase the intensity of the tone. However, in some cases, attempting to emit sufficient energy in a short amount of time may damage speaker drivers of the playback device.

Some implementations may balance these considerations by instructing the playback device to emit a calibration sound having a period that is approximately ⅜th of a second in duration (e.g., in the range of ¼ to 1 second in duration). In other words, the calibration sound may repeat at a frequency of 2-4 Hz. Such a duration may be long enough to provide a tone of sufficient energy at each frequency to overcome background noise in a typical environment (e.g., a quiet room) but also be short enough that spatial resolution is kept in an acceptable range (e.g., less than a few feet assuming normal walking speed).

In some embodiments, the command may instruct the playback device to emit a hybrid calibration sound that combines a first component and a second component having respective waveforms. For instance, an example hybrid calibration sound might include a first component that includes noises at certain frequencies and a second component that sweeps through other frequencies (e.g., a swept-sine). A noise component may cover relatively low frequencies of the calibration frequency range (e.g., 10-50 Hz) while the swept signal component covers higher frequencies of that range (e.g., above 50 Hz). Such a hybrid calibration sound may combine the advantages of its component signals.

Figure 8:
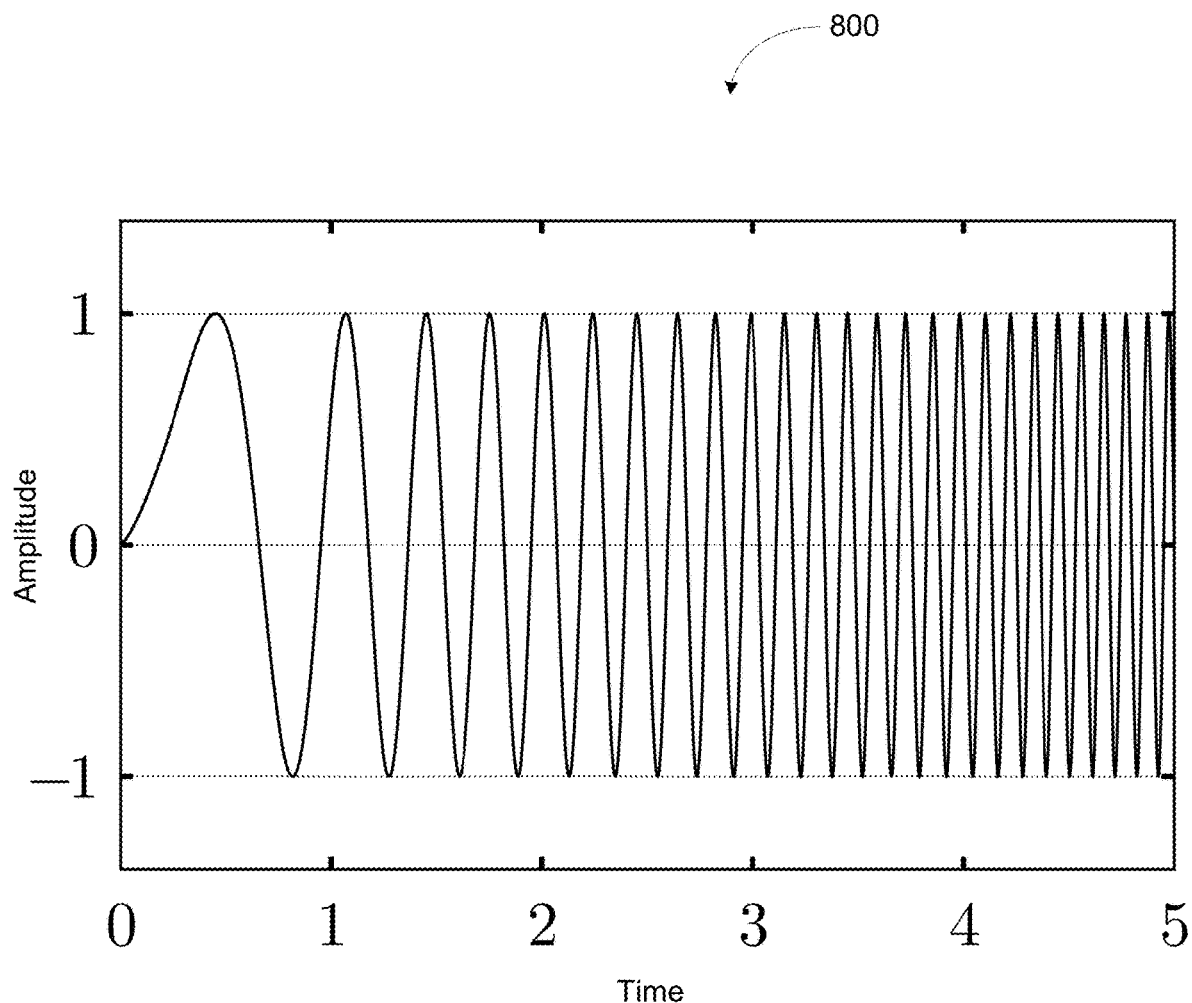
FIG. 8 illustrates an example chirp that increases in frequency over time.

A swept signal (e.g., a chirp or swept sine) is a waveform in which the frequency increases or decreases with time. Including such a waveform as a component of a hybrid calibration sound may facilitate covering a calibration frequency range, as a swept signal can be chosen that increases or decreases through the calibration frequency range (or a portion thereof). For example, a chirp emits each frequency within the chirp for a relatively short time period such that a chirp can more efficiently cover a calibration range relative to some other waveforms. FIG. 8 shows a graph 800 that illustrates an example chirp. As shown in FIG. 8, the frequency of the waveform increases over time (plotted on the X-axis) and a tone is emitted at each frequency for a relatively short period of time.

However, because each frequency within the chirp is emitted for a relatively short duration of time, the amplitude (or sound intensity) of the chirp must be relatively high at low frequencies to overcome typical background noise. Some speakers might not be capable of outputting such high intensity tones without risking damage. Further, such high intensity tones might be unpleasant to humans within audible range of the playback device, as might be expected during a calibration procedure that involves a moving microphone. Accordingly, some embodiments of the calibration sound might not include a chirp that extends to relatively low frequencies (e.g., below 50 Hz). Instead, the chirp or swept signal may cover frequencies between a relatively low threshold frequency (e.g., a frequency around 50-100 Hz) and a maximum of the calibration frequency range. The maximum of the calibration range may correspond to the physical capabilities of the channel(s) emitting the calibration sound, which might be 20,000 Hz or above.

A swept signal might also facilitate the reversal of phase distortion caused by the moving microphone. As noted above, a moving microphone causes phase distortion, which may interfere with determining a frequency response from a detected calibration sound. However, with a swept signal, the phase of each frequency is predictable (as Doppler shift). This predictability facilitates reversing the phase distortion so that a detected calibration sound can be correlated to an emitted calibration sound during analysis. Such a correlation can be used to determine the effect of the environment on the calibration sound.

As noted above, a swept signal may increase or decrease frequency over time. In some embodiments, the control device may instruct the playback device to emit a chirp that descends from the maximum of the calibration range (or above) to the threshold frequency (or below). A descending chirp may be more pleasant to hear to some listeners than an ascending chirp, due to the physical shape of the human ear canal. While some implementation may use a descending swept signal, an ascending swept signal may also be effective for calibration.

As noted above, example calibration sounds may include a noise component in addition to a swept signal component. Noise refers to a random signal, which is in some cases filtered to have equal energy per octave. In embodiments where the noise component is periodic, the noise component of a hybrid calibration sound might be considered to be pseudorandom. The noise component of the calibration sound may be emitted for substantially the entire period or repetition of the calibration sound. This causes each frequency covered by the noise component to be emitted for a longer duration, which decreases the signal intensity typically required to overcome background noise.

Moreover, the noise component may cover a smaller frequency range than the chirp component, which may increase the sound energy at each frequency within the range. As noted above, a noise component might cover frequencies between a minimum of the frequency range and a threshold frequency, which might be, for example around a frequency around 50-100 Hz. As with the maximum of the calibration range, the minimum of the calibration range may correspond to the physical capabilities of the channel(s) emitting the calibration sound, which might be 20 Hz or below.

Figure 9:
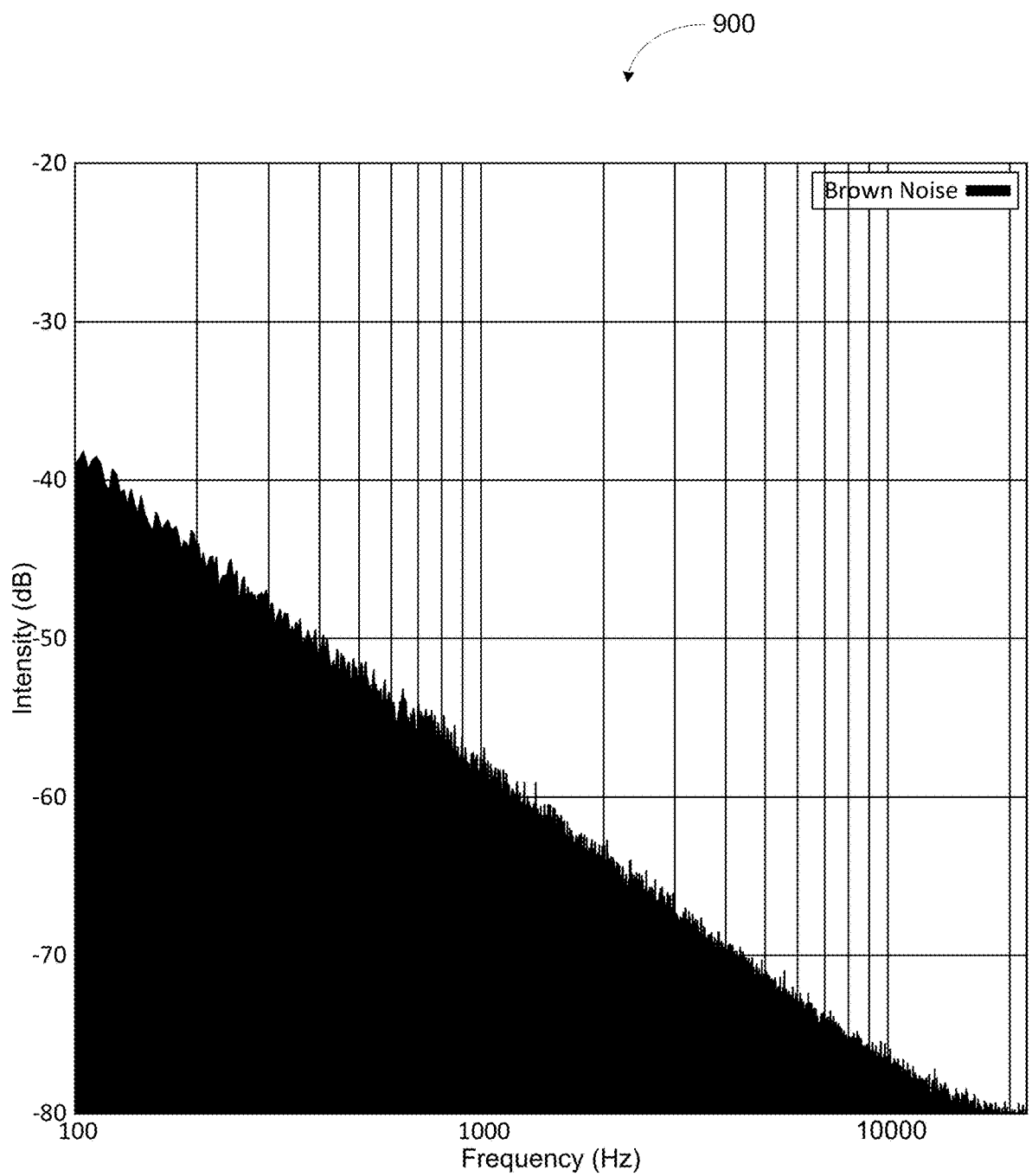
FIG. 9 shows an example brown noise spectrum.

FIG. 9 shows a graph 900 that illustrates an example brown noise. Brown noise is a type of noise that is based on Brownian motion. In some cases, the playback device may emit a calibration sound that includes a brown noise in its noise component. Brown noise has a "soft" quality, similar to a waterfall or heavy rainfall, which may be considered pleasant to some listeners. While some embodiments may implement a noise component using brown noise, other embodiments may implement the noise component using other types of noise, such as pink noise or white noise. As shown in FIG. 9, the intensity of the example brown noise decreases by 6 dB per octave (20 dB per decade).

Some implementations of a hybrid calibration sound may include a transition frequency range in which the noise component and the swept component overlap. As indicated above, in some examples, the control device may instruct the playback device to emit a calibration sound that includes a first component (e.g., a noise component) and a second component (e.g., a sweep signal component). The first component may include noise at frequencies between a minimum of the calibration frequency range and a first threshold frequency, and the second component may sweep through frequencies between a second threshold frequency and a maximum of the calibration frequency range.

To overlap these signals, the second threshold frequency may a lower frequency than the first threshold frequency. In such a configuration, the transition frequency range includes frequencies between the second threshold frequency and the first threshold frequency, which might be, for example, 50-100 Hz. By overlapping these components, the playback device may avoid emitting a possibly unpleasant sound associated with a harsh transition between the two types of sounds.

FIGS. 10A and 10B illustrate components of example hybrid calibration signals that cover a calibration frequency range 1000. FIG. 10A illustrates a first component 1002A (i.e., a noise component) and a second component 1004A of an example calibration sound. Component 1002A covers frequencies from a minimum 1008A of the calibration range 1000 to a first threshold frequency 1008A. Component 1004A covers frequencies from a second threshold 1010A to a maximum of the calibration frequency range 1000. As shown, the threshold frequency 1008A and the threshold frequency 1010A are the same frequency.

FIG. 10B illustrates a first component 1002B (i.e., a noise component) and a second component 1004B of another example calibration sound. Component 1002B covers frequencies from a minimum 1008B of the calibration range 1000 to a first threshold frequency 1008A. Component 1004A covers frequencies from a second threshold 1010B to a maximum 1012B of the calibration frequency range 1000. As shown, the threshold frequency 1010B is a lower frequency than threshold frequency 1008B such that component 1002B and component 1004B overlap in a transition frequency range that extends from threshold frequency 1010B to threshold frequency 1008B.

Figure 11:
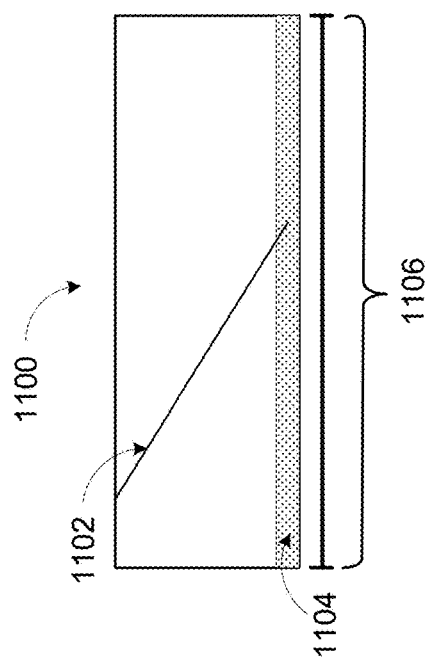
FIG. 11 shows a frame illustrating an iteration of an example periodic calibration sound.

FIG. 11 illustrates one example iteration (e.g., a period or cycle) of an example hybrid calibration sound that is represented as a frame 1100. The frame 1100 includes a swept signal component 1102 and noise component 1104. The swept signal component 1102 is shown as a downward sloping line to illustrate a swept signal that descends through frequencies of the calibration range. The noise component 1104 is shown as a region to illustrate low-frequency noise throughout the frame 1100. As shown, the swept signal component 1102 and the noise component overlap in a transition frequency range. The period 1106 of the calibration sound is approximately ⅜ths of a second (e.g., in a range of ¼ to ½ second), which in some implementation is sufficient time to cover the calibration frequency range of a single channel.

Figure 12:
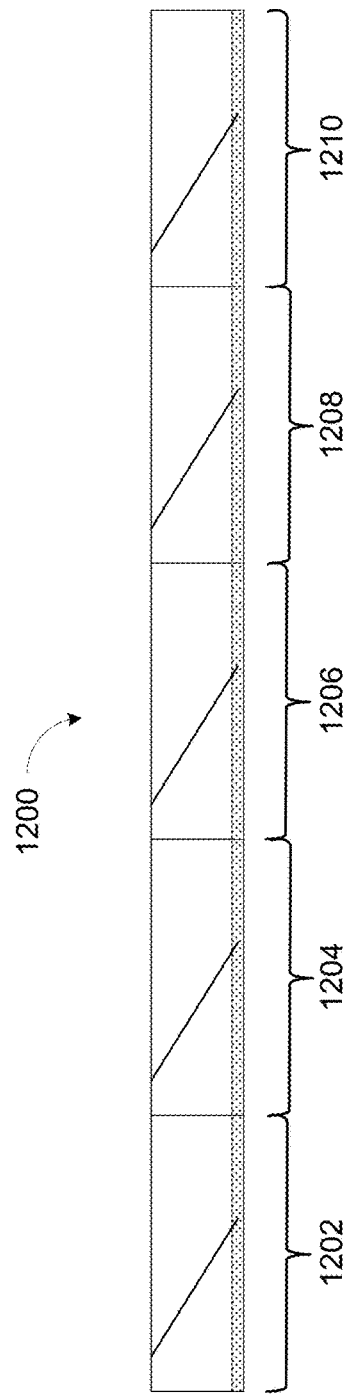
FIG. 12 shows a series of frames illustrating iterations of an example periodic calibration sound.

FIG. 12 illustrates an example periodic calibration sound 1200. Five iterations (e.g., periods) of hybrid calibration sound 1100 are represented as a frames 1202, 1204, 1206, 1208, and 1210. In each iteration, or frame, the periodic calibration sound 1200 covers a calibration frequency range using two components (e.g., a noise component and a swept signal component).

In some embodiments, a spectral adjustment may be applied to the calibration sound to give the calibration sound a desired shape, or roll off, which may avoid overloading speaker drivers. For instance, the calibration sound may be filtered to roll off at 3 dB per octave, or 1/f. Such a spectral adjustment might not be applied to vary low frequencies to prevent overloading the speaker drivers.

In some embodiments, the calibration sound may be pre-generated. Such a pre-generated calibration sound might be stored on the control device, the playback device, or on a server (e.g., a server that provides a cloud service to the media playback system). In some cases, the control device or server may send the pre-generated calibration sound to the playback device via a network interface, which the playback device may retrieve via a network interface of its own. Alternatively, a control device may send the playback device an indication of a source of the calibration sound (e.g., a URI), which the playback device may use to obtain the calibration sound.

Alternatively, the control device or the playback device may generate the calibration sound. For instance, for a given calibration range, the control device may generate noise that covers at least frequencies between a minimum of the calibration frequency range and a first threshold frequency and a swept sine that covers at least frequencies between a second threshold frequency and a maximum of the calibration frequency range. The control device may combine the swept sine and the noise into the periodic calibration sound by applying a crossover filter function. The cross-over filter function may combine a portion of the generated noise that includes frequencies below the first threshold frequency and a portion of the generated swept sine that includes frequencies above the second threshold frequency to obtain the desired calibration sound. The device generating the calibration sound may have an analog circuit and/or digital signal processor to generate and/or combine the components of the hybrid calibration sound.

In some embodiments, prior to sending the command that instructs the playback device to emit the calibration sound, the control device may determine whether the ambient noise in the environment exceeds a threshold level, such that the ambient noise might affect the calibration procedure. The threshold level may be consistent with a quiet room (e.g., 30-50 dB). If the ambient noise exceeds the threshold sound pressure level, the control device may cause a graphical interface to display a request to lower the ambient noise level of the calibration environment. During or after providing such a display, the control device may re-test the sound pressure level of the environment to determine whether ambient noise of the environment has been reduced to below the threshold level. While a control device has been described by way of example as testing the ambient sound pressure level, in alternative embodiments the playback device may determine whether the ambient noise in the environment exceeds the threshold level and transmit this status (or the sound pressure level of the environment) to the control device.

The instruction that causes the playback device to emit the calibration sound may include (or be accompanied by in a separate transmission) parameters that influence the calibration procedure. For instance, the control device may send an indication of the type of microphone (or the type of control device, which may indicate the type of microphone) to the playback device. The microphone that is ultimately used to detect the calibration sound may have a response of its own, which may influence how the calibration sound is perceived. For instance, a given microphone might be sensitive to frequencies between 10 Hz and 22,000 Hz, such that any portion(s) of the calibration sound which are outside of this range are unable to be detected by the microphone. As another example, a particular microphone might be more or less sensitive to certain frequencies, such that certain frequencies may be detected by the microphone as relatively louder or quieter. Some calibration procedures may be improved by offsetting such characteristics of the microphone.

Another parameter that may influence the calibration procedure is the room size, as playback device may emit the calibration sound at a volume that is proportional to the room size. For instance, when receiving an indication that the calibration environment is a relatively large room, the playback device may emit the calibration sound with at a first volume level (which is a relatively high sound pressure level). Conversely, when receiving an indication that the calibration environment is a relatively small room, the playback device may emit the calibration sound with at a second volume level that is a lower sound pressure level than the first volume level. A higher sound pressure level may facilitate the calibration sound propagating through a large environment and reflecting back to the microphone with sufficient intensity to be detectable over ambient noise.

The calibration sound may also be based on the type of playback device. Some playback devices may emit sounds at certain frequencies with more or less intensity than other frequencies. For instance, a playback device with a tweeter may emit high frequencies at a higher intensity than a playback device without a tweeter. Further, such a playback device might be capable of outputting higher frequencies than a playback device without a tweeter. Accordingly, in some embodiments, the playback device may adjust the calibration sound to increase or decrease the sound intensity at certain frequencies, or might determine a particular calibration range based on the type of playback device (and its capabilities).

c. Detect Emitted Calibration Sound(s)

In FIG. 5, at block 506, implementation 500 involves detecting the emitted calibration sound. For instance, a control device, such as control device 126 of media playback system 100, may detect, via a microphone, at least a portion of the emitted calibration sound. Given that the microphone is moving throughout the calibration environment, the control device may detect iterations of the calibration sound at different physical locations of the environment, which may provide a better understanding of the environment as a whole.

For example, referring back to FIG. 7, control device 126 may detect calibration sounds emitted by a playback device (e.g., playback device 108) at various points along the path 700 (e.g., at point 702 and/or point 704). Alternatively, the control device may record the calibration signal along the path. In some embodiments, the playback device may play a periodic calibration signal (or perhaps repeat the same calibration signal) such that the playback device records an instance of the calibration signal at different points along the paths. Comparison of such recordings may indicate how the acoustic characteristics change from one physical location in the environment to another, which influences the calibration settings chosen for the playback device in that environment.

After the control device records the calibration sounds, the recordings of the calibration sounds may be analyzed to determine calibration settings for the playback device. In some embodiments, the control device may analyze the calibration sounds itself. Alternatively, the control device may transmit the recordings (or a portion thereof) to another computing system (perhaps a computing system with more processing power, such as a personal computer or server (e.g., a server involved in providing a cloud computing service).

Figure 13:
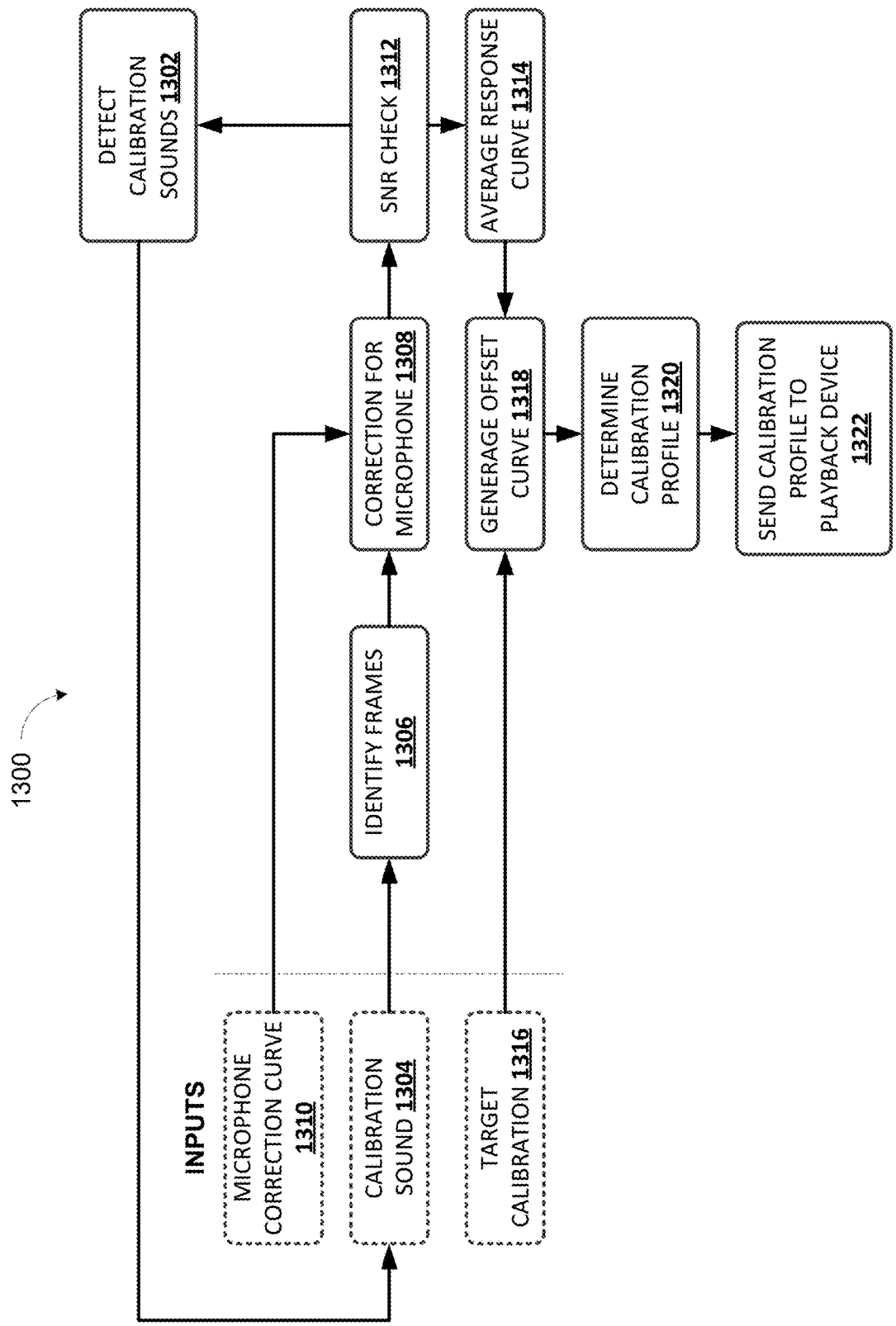
FIG. 13 illustrates an example technique to analyze a detected calibration sound.

FIG. 13 illustrates an example implementation 1300 of a technique to analyze a detected calibration sound. At block 1302, a control device detects calibration sounds, perhaps using the techniques discussed in connection with block 506 of FIG. 6. At block 1304, one or more processors (e.g., processor(s) 202 of control device 200 illustrated in FIG. 2) receive the detected calibration sounds as an input. At block 1306, the one or more processors identify frames (e.g., periods) of the calibration sound, such as frames 1202 through 1210 of FIG. 12. As discussed above, individual frames may include a repetition of the calibration sound such that the frame includes a detect sound that covers frequencies across a calibration frequency range.

At block 1308, the one or more processors correct for characteristics of the microphone used to detect the calibration sound. To facilitate such correction, at block 1310, the one or more processors receive a microphone correction curve that indicates the frequency response of the microphone. Using such a curve, the one or more processors can offset effects of the particular microphone on the detected calibration sound.

At block 1312, the one or more processors determine whether each the detected calibration sound in each frame satisfies a threshold signal to noise ratio. Detected calibration sounds that do not satisfy this threshold may be excluded from the analysis, as ambient noise may have interfered with the emission and detection of these instances of the calibration sound.

At block 1314, the one or more processors average the response curves of the detected calibration sounds. As noted above, with a moving microphone, repetitions of the calibration sound are detected at different physical locations within the environment, thereby providing samples that are spaced throughout the environment. By averaging multiple response curves from different locations within the environment, the one or more processors may determine a response indicative of the environment as a whole.

At block 1316, the one or more processors may receive a target calibration. In some embodiments, the target calibration may be a flat response (i.e., a calibration that treats different frequencies equally). In other embodiments, the target calibration may emphasize certain frequencies and de-emphasize others. For instance, the target calibration may emphasis bass and treble frequencies.

At block 1318, the one or more processors generate an offset curve based on the averaged response and the target calibration. In particular, the one or more processors may determine a offset curve that achieves the target calibration by offsetting the averaged responses of the environment.

At block 1320, the one or more processors determine a calibration profile. Such a calibration profile may include one or more coefficients to apply to the playback device, to cause the calibration device to offset the response of the environment. At block 1322, the calibration profile is transmitted to the playback device, which may adopt the calibration profile.

Some further example techniques for analyzing such recordings are described in U.S. patent application Ser. No. 13/536,493 filed Jun. 28, 2012, entitled "System and Method for Device Playback Calibration," U.S. patent application Ser. No. 14/216,306 filed Mar. 17, 2014, entitled "Audio Settings Based On Environment," and U.S. patent application Ser. No. 14/481,511 filed Sep. 9, 2014, entitled "Playback Device Calibration," which are incorporated herein in their entirety. IV. Example Techniques to Facilitate Calibration of Multiple Playback Devices As discussed above, embodiments described herein may facilitate the calibration of multiple playback devices by causing the playback devices to emit a sequence of calibration sounds. FIG. 14 illustrates an example implementation 1400 to cause multiple playback devices to emit calibration sounds in sequence.

a. Detect Trigger Condition that Initiates Calibration of Multiple Playback Channels At block 1402, implementation 1400 involves detecting a trigger condition that initiates calibration of multiple playback channels. For instance, a control device, such as control device 126 shown in FIG. 1, may detect a trigger condition that causes control device 126 to initiate calibration of two or more playback channels (e.g., two or more speakers of a single playback device such as one of playback devices 102-124 or possibly two or more of playback devices 102-124). Alternatively, a playback device of a media playback system (e.g., media playback system 100) may detect such a trigger condition (and perhaps relay an indication of that trigger condition to a control device). Calibration of multiple playback devices may involve the multiple playback devices emitting a respective calibration sound according to a sequence. After detecting these emitted calibration sounds, the detected calibration sounds may be analyzed so as to determine how one or more respective acoustic parameters of the playback device's speakers can be adjusted in an attempt to improve acoustic characteristic of those speakers within the calibration environment.

As noted above, a trigger condition may initiate calibration of multiple playback channels. A given playback device may include multiple speakers. In some embodiments, these multiple channels may be calibrated individually as respective channels. Alternatively, the multiple speakers of a playback device may be calibrated together as one channel. In further cases, groups of two or more speakers may be calibrated together as respective channels. For instance, some playback devices, such as sound bars intended for use with surround sound systems, may have groupings of speakers designed to operate as respective channels of a surround sound system. Each grouping of speakers may be calibrated together as one playback channel (or each speaker may be calibrated individually as a separate channel).

In some embodiments, detecting the trigger condition may involve detecting a trigger condition that initiates calibration of a particular zone. As noted above in connection with the example operating environment, playback devices of a media playback system may be joined into a zone in which the playback devices of that zone operate jointly in carrying out playback functions. For instance, two playback devices may be joined into a bonded zone as respective channels of a stereo pair. Alternatively, multiple playback devices may be joined into a zone as respective channels of a surround sound system. Some example trigger conditions may initiate a calibration procedure that involves calibrating the playback devices of a zone. As noted above, within various implementations, a playback device with multiple speakers may be treated as a mono playback channel or each speaker may be treated as its own channel, among other examples.

In further embodiments, detecting the trigger condition may involve detecting a trigger condition that initiates calibration of a particular zone group. Two or more zones, each including one or more respective playback devices, may be joined into a zone group of playback devices that are configured to play back media in synchrony. In some cases, a trigger condition may initiate calibration of a given device that is part of such a zone group, which may initiate calibration of the playback devices of the zone group (including the given device). Alternatively, Various types of trigger conditions may initiate the calibration of the multiple playback devices. In some embodiments, detecting the trigger condition involves detecting input data indicating a selection of a selectable control. For instance, a control device, such as control device 126, may display an interface (e.g., control interface 600 of FIG. 6), which includes one or more controls that, when selected, initiate calibration of a playback device, or a group of playback devices (e.g., a zone). Alternatively, detecting the trigger condition may involve a playback device detecting that the playback device has become uncalibrated, which might be caused by moving the playback device to a different position or location within the calibration environment. For instance, an example trigger condition might be that a physical movement of one or more of the plurality of playback devices has exceeded a threshold magnitude. In further examples, detecting the trigger condition may involve a device (e.g., a control device or playback device) detecting a change in configuration of the media playback system, such as a new playback device being added to the system. Other examples are possible as well.

b. Send Command that Instructs Playback Device(s) to Emit Calibration Sound

Referring back to FIG. 14, at block 1404, implementation 1400 involves sending a command that instructs the multiple playback devices to emit respective calibration sounds. For instance, a control device, such as control device 126 of media playback system 100, may send respective commands that cause two or more playback devices (e.g., two or more of playback devices 102-124) to emit a calibration sound. The control device may send the commands via a network interface (e.g., a wired or wireless network interface). Upon receiving such a command, each playback device may responsively emit a calibration sound.

The command may instruct the multiple playback devices to emit the calibration sounds according to a sequence. The sequence may govern the order in which the playback devices emit the calibration sound. For example, the commands may instruct a first playback device to emit the calibration sound first in the sequence, a second playback device to emit the calibration sound second in the sequence, a third playback device to emit the calibration sound third in the sequence, and so on for the given number of playback channels to be calibrated during a given calibration procedure.

As described above in connection with some example techniques, a calibration sound may include frequencies that cover the calibration frequency range. As noted above, some example calibration frequency ranges may include frequencies that the speaker(s) of a given playback channel is capable of emitting, or perhaps frequencies over which the calibration procedure is intended to calibrate the channel. Example calibration ranges may be inclusive of the range of 20-20,000 Hz, which is generally considered to be the range of human hearing. Example calibration sound may cover this range using a variety of waveforms. For instance, upward, downward, or oscillating swept-sine or chirp tones may cover such a frequency range by varying frequency over time. Random or pseudorandom noise may cover a calibration frequency range. Some musical compositions (e.g., songs) may cover the calibration frequency range.

In some embodiments, the playback devices may emit a hybrid calibration sound, such as the example hybrid calibration sound discussed above. For instance, each playback device may emit a calibration sound that includes a noise component and a swept signal component. The noise component may cover low frequencies of a calibration range (e.g., a range inclusive of a minimum of the calibration frequency range to a first threshold) while the swept signal component covers higher frequencies (e.g., the higher frequencies of the calibration not covered by the noise component). In some cases, component of a hybrid calibration sound may overlap in a transition frequency range, which may have various benefits, such as a more pleasant sound.

Alternatively, each playback devices may emit two or more sounds during each iteration (or period). Like components of a hybrid calibration sound, each sound may cover different portions of a calibration frequency range (with possibly some overlap). For instance, a first sound may include low frequency noise (e.g., noise at frequencies below a certain threshold). A second sound may include higher frequencies, so as to cover a calibration frequency range in combination with the first sound. The second sound may cover higher frequencies of the frequency range using a variety of waveforms such as a sine-sweep or chirp tone, or possibly a different type of noise, among other examples.

Using different waveforms may affect the minimum duration of each cycle or repetition of the calibration sound. Some calibration procedures require at least a minimum amount of sound energy to be emitted at each frequency of the calibration range to overcome background noise. A uniform signal may cover a calibration frequency range more quickly by proceeding through the frequencies of the range in an orderly manner. For example, a swept signal may efficiently cover a calibration frequency range by varying frequency at a rate that emits sufficient energy at each frequency. In contrast, less uniform signals might cause insufficient energy to be emitted at some frequencies (and perhaps excessive energy at other frequencies). For example, a hip hop song that is heavy on bass and light on treble may repeat certain bass frequencies often which may cause excessive energy to be emitted at those frequencies and not enough energy at treble frequencies, which may result in the song being emitted for a longer duration in order to cover the calibration frequency range with sufficient energy at each frequency.

A shorter duration of each cycle or repetition of the calibration sound may improve the spatial resolution of the calibration procedure. Assuming a moving microphone at substantially constant velocity, a calibration sound that has a shorter period will result in samples that are closer together within the calibration environment (i.e., with higher spatial resolution). As noted above, for a single playback channel, a sound that is approximately ⅜th of a second in length is long enough to cover a calibration frequency range with sufficient energy at each frequency while maintain good spatial resolution. However, when calibrating multiple playback channels, each playback channel should emit a calibration sound that covers the calibration frequency range. Instructing the multiple playback devices to emit the calibration sound successively may increase the total duration of the calibration sounds to a point where spatial resolution is degraded.

To maintain acceptable spatial resolution when calibrating multiple playback channels, the command may instruct the multiple playback devices to concurrently emit the calibration sound. By emitting the calibration sounds concurrently, rather than successively, the time (and distance) between samples may be kept to an acceptable distance (e.g. under a meter). However, concurrently emitted signals may interfere with one another if the same frequencies are emitted at the same time. For instance, if two playback channels emit a 1000 Hz tone concurrently, the respective 1000 Hz tones from each channel might not be able to be independently detected.

To avoid interference, the command may instruct the playback channels to stagger the calibration sounds such that each successive playback channel in the sequence emits the calibration sound after a delay relative to the preceding playback channel in the sequence. By staggering the start times of each calibration sound, a first cycle of calibration sounds may fully (or partially) overlap without causing interference, as, at any given point, each playback channel may output a different portions calibration frequency range. However, because the calibration sounds repeat, successive cycles may interfere with preceding cycles. In an attempt to avoid this possibility, the duration of each period or repetition of the calibration sound may be stretched in proportion to the number of playback channels to be calibrated.

Figure 15:
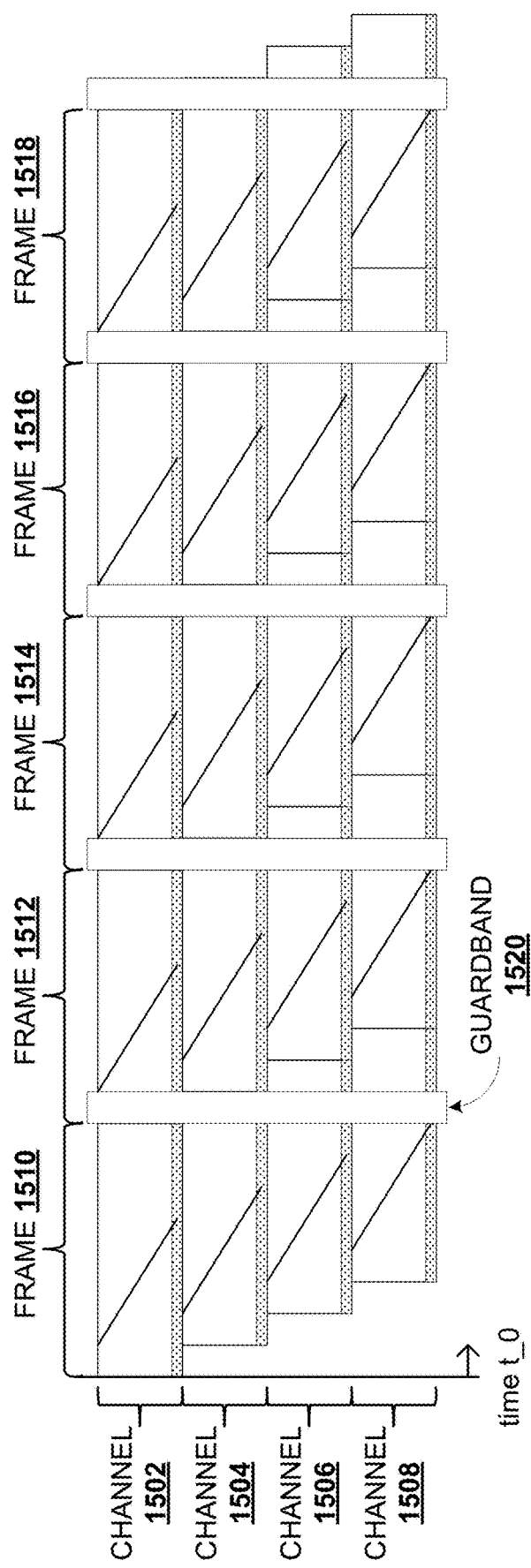
FIG. 15 illustrates example calibration sounds as might be emitted by respective playback channels.

To illustrate, FIG. 15 shows example hybrid calibration sounds as might be emitted during an example calibration procedure of playback channels 1502, 1504, 1506, and 1508. The hybrid calibration sounds in FIG. 15 are based on hybrid calibration sound 1100 of FIG. 11, which can be considered a "baseline" tone that is used in the calibration of a single playback channel. To avoid overlapping frequencies, the example hybrid calibration sounds are stretched and staggered.

More particularly, playback channels 1502, 1504, 1506, and 1508 stagger output of the calibration sound relative to one another. At time t 0, playback channel 1502 begins emitting the calibration sound. After a delay, playback channel 1504 begins emitting the calibration sound. After another delay, playback channel 1506 begins emitting the calibration sound. Likewise, playback channel 1508 begins emitting the calibration sound after a delay relative to playback channel 1506. The amount of delay may vary by implementation. In this example, each playback channel delays output of the calibration by one half of the duration of the baseline tone (i.e., ½ of ⅜ths of a second, or 3/16ths of a second). As shown in FIG. 15, this delay produces a staggering of the calibration sounds over time, which helps to prevent overlapping of frequencies.

The hybrid calibration sounds in FIG. 15 have been stretched such that they have a duration that is four times the duration of the baseline tone (i.e., hybrid calibration sound 1100). This multiple of 4× is equal to the number of playback channels to be calibrated (i.e., channels 1502, 1504, 1506, and 1508). By stretching the baseline tone in proportion to the number of channels, there is sufficient time in each frame for each playback channel to cover the calibration frequency range without overlapping frequencies. As shown in FIG. 15, during each of frames 1510, 1512, 1514, 1418, and 1520, channels 1502, 1504, 1506 and 1508 emit respective calibration sounds that cover the calibration frequency range. As described above, hybrid calibration sound 1100 includes a noise component that covers frequencies of the calibration frequency range up to a threshold and a swept signal component that covers frequencies of the calibration frequency range down to the threshold (perhaps with some overlap between the components).

Frames 1510, 1512, 1514, 1418, and 1520 are separated by respective guardbands (e.g., guardband 1520) in which no portion of a swept signal is emitted by any of the playback devices. This guardband provides time for the emitted calibration sounds to propagate through the environment to the moving microphone before the next iteration of the calibration sounds begin. By providing this propagation time, the guardband helps to prevent overlapping frequencies, which may interfere with calibration.

In FIG. 15, five iterations of the calibration sound emitted by each playback channel are shown by way of example. During example calibration procedures, the calibration sound may be repeatedly emitted multiple times so as to generate samples throughout the environment (given that the microphone that is detecting the calibration sound is moving). For instance, during some example calibration procedures, the calibration sounds depicted in FIG. 15 may repeat for a calibration duration of 30-45 seconds, thereby generating 20-30 samples (given that the calibration sounds have a duration of 1.5 seconds, which is equivalent to a baseline duration of ⅜ second multiplied by four channels). The number of repetitions and the duration of the calibration sound may vary by implementation and number of playback channels, which may cause the calibration duration to vary.

In some embodiments, the calibration sounds emitted by the playback devices may be stored as one or more recordings. For instance, a control device may store a recording (e.g., a sound file) with multiple channels perhaps with each of the multiple channels containing a calibration sound for a different channel (or playback device) to be calibrated. In some example implementations, the calibration sound emitted by each playback channel may be stored as a channel of a multi-channel file (e.g., an Ogg file). Such a recording may pre-stagger the calibration sounds emitted by each playback channel and pre-stretch the calibration sounds to a duration that is proportional to the number of playback channels to be calibrated, such that by initiating playback of the multi-channel in synchrony on the multiple playback channels, the calibration sounds emitted by the playback channels device do not overlap frequencies.

In some cases, the playback devices of the media playback system might not have access to recordings with the same number of channels as the number of playback channels to be calibrated. For instance, the playback devices may only have recordings for 1, 2, 4, or 8 channels (i.e., powers of two). In such embodiments, a particular recording may be selected based on the number of channels to be calibrated. For instance, to calibrate three channels, the number of channels (3) might be rounded up to the four channel recording, as a four channel recording has sufficient channels to calibrate three playback channels. The fourth channel may remain unused during the calibration of the three playback channels. Likewise, to calibrate five playback channels, a control device may instruct the playback channels to emit respective channels of an eight channel recording.

Such an implementation may reduce the number of recording that are maintained by a given media playback system, as a recording might not need to be stored for every possible combination of channels. While recordings with 1, 2, 4, and 8 channels have been described by way of example, the respective number of channels in each stored recording may vary by implementation. For instance, in some cases, three and six channel recordings may be stored, as calibrating three channel (e.g., 2.1 stereo with a subwoofer) zones or six channel (e.g., 5.1 surround) zones might be relatively common calibration procedures.

As an alternative to pre-recorded calibration sounds, the calibration sounds may be mixed or generated as part of the calibration procedure. For instance, a device of the media playback system (e.g., a playback device or a control device) may have access to component tones (e.g., noise and swept signal components, among other examples) and combine those components using a crossover filter function or other signal processing technique using an analog filter or digital signal processor. In some cases, the device may generate the component tones prior to mixing the tones into calibration sound.

In some embodiments, the calibration sound may be generated and/or stored on a first device (e.g., a control device or remote server) and be sent to the playback device for playback by one or more playback channels during the calibration. Such an approach may provide greater flexibility in the calibration sounds available to the media playback system. Additionally, this approach may alleviate the need for the playback device to contain data storage large enough to store the calibration sound. Further, as another possible benefit, storing the calibration sound on another device may facilitate updating the calibration sound with new recordings.

c. Detect Emitted Calibration Sound(s)

In FIG. 14, at block 1406, implementation 1400 involves detecting the emitted calibration sounds. For instance, a control device, such as control device 126 of media playback system 100, may detect, via a microphone, at least a portion of the emitted calibration sounds. Given that the microphone is moving throughout the calibration environment, the control device may detect iterations of the calibration sounds at different physical locations within the environment.

So as to calibrate the individual playback channels, the control device may determine which playback channel emitted each particular instance of the calibration sound that was detected by the control device. After correlating each detected calibration sound to the playback channel that emitted that particular instance of the calibration sound, the recordings of the calibration sounds may be analyzed to determine calibration settings for the playback device. In some embodiments, analysis of the calibration sounds may involve a device, such as a control device or remote server, determining from the identified calibration sounds a respective frequency response of each playback channel. After determining such a response, the device may calibrate each playback device by sending the device a command with calibration parameters that equalize the determined frequency response to a desired frequency response (e.g., a "flat" frequency response).

In some embodiments, a device may identify the detected calibration sounds by the order in which the calibration sounds were detected. As noted above, the command that instructs the multiple playback devices to emit respective calibration sounds may instruct the multiple playback devices to emit the calibration sounds according to a sequence that governs the order in which the calibration sounds are emitted. Given that sequence is known to the control device, the control device may determine which playback channel emitted each particular instance of the calibration sound by the order in which the calibration sounds were detected, as that order may be the same as governed by the sequence.

Within examples, the calibration sound emitted by each playback channel may include a unique "notch." Such a notch may be a substantial increase or decrease in amplitude at a particular frequency. Each playback channel may emit a calibration sound with a notch at a different frequency, which may act as a watermark. For example, the commands send to the playback devices may instruct a first playback channel to emit a calibration sound with a notch at a first frequency (e.g., 1000 Hz), a second playback channel to emit a calibration sound with a notch at a second frequency (e.g., 5000 Hz), and so on for the given number of playback channels to be calibrated during a given calibration procedure. Upon detecting the calibration sound with the notch at the first frequency, a device may be able to identify that calibration sound as being emitted by the first playback channel. Likewise, a notch at the second frequency in a detect calibration sound may identify that calibration sound as being emitted by the second playback channel. Such a technique may be used in combination with identifying the calibration sounds based on the order in which they were emitted and detected, which may improve identification reliability.

V. Example Techniques to Emit Calibration Sound(s)

As discussed above, embodiments described herein may facilitate the calibration of one or more playback devices. FIG. 16 illustrates an example implementation 1600 that involves a playback device to emitting a hybrid calibration sound, according to an example embodiment.

a. Receive Command that Instructs Playback Device(s) to Emit Calibration Sound(s)

At block 1602, implementation 1600 involves receiving a command that instructs a playback device to emit a calibration sound. For instance, a playback device, such as one of playback devices 102-124, may receive a command that causes the playback device to emit a calibration sound. As noted above, such a command may be sent from a control device (e.g., control device 126 or control device 128 of media playback system 100). The playback device may receive the command via a network interface (e.g., a wired or wireless network interface).

The command may instruct the playback device to emit a calibration sound that includes frequencies that cover a calibration frequency range. As noted above, a control device may analyze the calibration sound over a range of frequencies over which the playback device is to be calibrated (i.e., a calibration range). Accordingly, the command may instruct the playback device to emit a calibration sound that covers the calibration frequency range. The calibration frequency range may include a range of frequencies that the playback device is capable of emitting (e.g., 15-30,000 Hz) and may be inclusive of frequencies that are considered to be in the range of human hearing (e.g., 20-20,000 Hz). By emitting a calibration tone covering such a range of frequencies, a frequency response that is inclusive of that range may be determined for the playback device.

In some embodiments, the playback device may repeatedly emit the calibration sound during the calibration procedure such that the calibration sound covers the calibration frequency range during each repetition. With a moving microphone, repetitions of the calibration sound are detected at different physical locations within the environment, thereby providing samples that are spaced throughout the environment. In some cases, the calibration sound may be periodic calibration signal in which each period covers the calibration frequency range.

As described above, such a command may instruct the playback device to emit a hybrid calibration sound that combines a first component and a second component having respective waveforms. For example, an example hybrid calibration sound might include two components: a first component that includes noises at certain frequencies and a second component that sweeps through other frequencies (e.g., a swept-sine). The noise component may cover lower frequencies of the calibration frequency range (e.g., 10-50 Hz) while the swept signal component covers higher frequencies of that range (e.g., above 50 Hz).

Some implementations of a hybrid calibration sound may include a transition frequency range in which the noise component and the swept component overlap. As indicated above, in some examples, the control device may instruct the playback device to emit a calibration sound that includes a first component (e.g., a noise component) and a second component (e.g., a sweep signal component). The first component may include noise at frequencies between a minimum of the calibration frequency range and a first threshold frequency, and the second component may sweep through frequencies between a second threshold frequency and a maximum of the calibration frequency range.

To overlap these signals, the second threshold frequency may a lower frequency than the first threshold frequency. In such a configuration, the transition frequency range includes frequencies between the second threshold frequency and the first threshold frequency, which might be, for example, 50-100 Hz. By overlapping these components, the playback device may avoid emitting a possibly unpleasant sound associated with a harsh transition between the two types of sounds.

In some embodiments, the calibration sound may be pre-generated. Such a pre-generated calibration sound might be stored on the control device, the playback device, or on a server (e.g., a server that provides a cloud service to the media playback system). In some cases, the playback device may receive the pre-generated calibration sound from a control device via a network interface. Alternatively, a playback device may receive an indication of a source of the calibration sound (e.g., a URI), which the playback device may use to obtain the calibration sound.

Alternatively, the playback device may generate the calibration sound. For instance, for a given calibration range, the playback device may generate noise that covers at least frequencies between a minimum of the calibration frequency range and a first threshold frequency and a swept sine that covers at least frequencies between a second threshold frequency and a maximum of the calibration frequency range. The playback device may combine the swept sine and the noise into the periodic calibration sound by applying a crossover filter function. The cross-over filter function may combine a portion of the generated noise that includes frequencies below the first threshold frequency and a portion of the generated swept sine that includes frequencies above the second threshold frequency to obtain the desired calibration sound. The playback device may have an analog circuit and/or digital signal processor to generate and/or combine the components of the hybrid calibration sound.

Within examples, the command may instruct the playback device to emit the calibration sounds according to a sequence with one or more additional playback device. The sequence may govern the order in which the playback devices emit the calibration sound. For example, the commands may instruct a first playback device to emit the calibration sound first in the sequence, a second playback device to emit the calibration sound second in the sequence, a third playback device to emit the calibration sound third in the sequence, and so on for the given number of playback channels to be calibrated during a given calibration procedure.

As noted above, a playback device may include multiple speakers. These multiple channels may be calibrated individually as respective channels. Alternatively, the multiple speakers of a playback device may be calibrated as one channel. In further cases, groups of two or more speakers may be calibrated together as respective channels.

As described above in connection with FIGS. 13 and 14, the command may instruct the playback device to stagger the calibration sounds such that each successive playback channel in the sequence emits the calibration sound after a delay relative to the preceding playback channel in the sequence. By staggering the start times of each calibration sound, a first cycle of calibration sounds may fully (or partially) overlap without causing interference, as, at any given point, each playback channel may output a different portions calibration frequency range. However, because the calibration sounds repeat, successive cycles may interfere with preceding cycles. In an attempt to avoid this possibility, the duration of each period or repetition of the calibration sound may be stretched in proportion to the number of playback channels to be calibrated.

b. Emit Calibration Sound(s)

Referring still to FIG. 16, at block 1604, implementation 1600 involves emitting a calibration sound. For example, the playback device (e.g., one of playback devices 102-124), may emit the calibration sound according to the received command that causes the playback device to emit the calibration sound. As described above, such a command may instruct the playback device to emit a particular calibration sound having certain characteristics, perhaps according to a particular sequence.

VI. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Example techniques may involve emitting a hybrid calibration sound. In one aspect, a method is provided. The method may involve receiving, via a network interface, a command that instructs the playback device to emit a calibration sound and responsively causing the one or more speakers to emit a periodic calibration sound that covers a calibration frequency range, where the periodic calibration sound comprises (i) a first component that includes noise at frequencies between a minimum of the calibration frequency range and a first threshold frequency, and (ii) a second component that sweeps through frequencies between a second threshold frequency and a maximum of the calibration frequency range.

In another aspect, a device is provided. The device includes a network interface, at least one processor, a data storage, and program logic stored in the data storage and executable by the at least one processor to perform operations. The operations may include receiving, via the network interface, a command that instructs the playback device to emit a calibration sound and responsively causing the one or more speakers to emit a periodic calibration sound that covers a calibration frequency range, where the periodic calibration sound comprises (i) a first component that includes noise at frequencies between a minimum of the calibration frequency range and a first threshold frequency, and (ii) a second component that sweeps through frequencies between a second threshold frequency and a maximum of the calibration frequency range.

In yet another aspect, a non-transitory computer readable memory is provided. The non-transitory computer readable memory has stored thereon instructions executable by a computing device to cause the computing device to perform operations. The operations may include receiving, via the network interface, a command that instructs the playback device to emit a calibration sound and responsively causing the one or more speakers to emit a periodic calibration sound that covers a calibration frequency range, where the periodic calibration sound comprises (i) a first component that includes noise at frequencies between a minimum of the calibration frequency range and a first threshold frequency, and (ii) a second component that sweeps through frequencies between a second threshold frequency and a maximum of the calibration frequency range.

Further example techniques may involve multiple playback devices emitting a calibration sound. In one aspect, a method is provided. The method may involve detecting a trigger condition that initiates calibration of a plurality of playback devices. The method may also involve sending, to a first playback device of the plurality, a command that instructs the first playback device to repeatedly emit a calibration sound according to a sequence, where the calibration sound cycles through frequencies of a calibration frequency range, and where a duration of the calibration sound is proportional to the given number of playback devices in the plurality. The method may further involve sending, to one or more additional playback devices of the plurality, respective commands that instruct the one or more additional playback devices to repeatedly emit the respective calibration sound according to the sequence, where the commands instruct the one or more additional playback devices to stagger emission of the calibration sounds such that each emitted calibration sound is delayed relative to a preceding calibration sound in the sequence. The method may also involve detecting, via a microphone, the emitted calibration sounds.

In another aspect, a device is provided. The device includes a network interface, at least one processor, a data storage, and program logic stored in the data storage and executable by the at least one processor to perform operations. The operations may include detecting a trigger condition that initiates calibration of a plurality of playback devices. The operations may also include sending, to a first playback device of the plurality, a command that instructs the first playback device to repeatedly emit a calibration sound according to a sequence, where the calibration sound cycles through frequencies of a calibration frequency range, and where a duration of the calibration sound is proportional to the given number of playback devices in the plurality. The operations may further include sending, to one or more additional playback devices of the plurality, respective commands that instruct the one or more additional playback devices to repeatedly emit the respective calibration sound according to the sequence, where the commands instruct the one or more additional playback devices to stagger emission of the calibration sounds such that each emitted calibration sound is delayed relative to a preceding calibration sound in the sequence. The operations may also include detecting, via a microphone, the emitted calibration sounds.

In yet another aspect, a non-transitory computer readable memory is provided. The non-transitory computer readable memory has stored thereon instructions executable by a computing device to cause the computing device to perform operations. The operations may include detecting a trigger condition that initiates calibration of a plurality of playback devices. The operations may also include sending, to a first playback device of the plurality, a command that instructs the first playback device to repeatedly emit a calibration sound according to a sequence, where the calibration sound cycles through frequencies of a calibration frequency range, and where a duration of the calibration sound is proportional to the given number of playback devices in the plurality. The operations may further include sending, to one or more additional playback devices of the plurality, respective commands that instruct the one or more additional playback devices to repeatedly emit the respective calibration sound according to the sequence, where the commands instruct the one or more additional playback devices to stagger emission of the calibration sounds such that each emitted calibration sound is delayed relative to a preceding calibration sound in the sequence. The operations may also include detecting, via a microphone, the emitted calibration sounds.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

We claim:

1. A first playback device comprising:
   multiple audio transducers;
   one or more amplifiers configured to drive the multiple audio transducers;
   one or more processors;
   a housing carrying the multiple audio transducers, the one or more amplifiers, the one or more processors, and data storage having stored thereon instructions that, when executed by the one or more processors, cause the first playback device to perform functions comprising:
      forming a particular playback configuration that configures the multiple audio transducers to form two or more channels, wherein each channel is formed by two or more audio transducers of the multiple audio transducers;
      receiving a command to initiate calibration of the particular playback configuration, wherein the calibration comprises emitting a calibration sound according to a sequence, wherein the sequence comprises the calibration sound cycling through frequencies of a calibration frequency range;
      based on the command, emitting the calibration sound contemporaneously via the two or more channels, wherein emission of the calibration sound by each channel is staggered such that each emitted calibration sound is delayed relative to a preceding emitted calibration sound;
      receiving data indicating audio processing coefficients that are based on one or more recordings of the emitted calibration sound; and
      applying the audio processing coefficients to audio content when playing back the audio content as part of the particular playback configuration.

2. The first playback device of claim 1, wherein the playback configuration is a surround sound playback configuration that configures the multiple audio transducers to form a front channel, a left channel, and a right channel.

3. The first playback device of claim 2, wherein the first playback device is in a bonded zone with one or more second playback devices that form respective surround channels, and wherein emitting the calibration sound comprises emitting the calibration sound contemporaneously with emission of the calibration sound by the one or more second playback devices, wherein emission of the calibration sound by each channel of the first playback device and emission of the calibration sound by each surround channel of the one or more second playback devices are staggered such that each emitted calibration sound is delayed relative to a preceding emitted calibration sound.

4. The first playback device of claim 1, wherein the particular playback configuration is a stereo pair playback configuration that configures the multiple audio transducers to form a left channel and a right channel.

5. The first playback device of claim 1, wherein the calibration sound is emitted for a duration of time that is proportional to a number of channels formed in the particular playback configuration.

6. The first playback device of claim 1, wherein the calibration sound comprises (i) a first component that includes noise frequencies between a minimum of the calibration frequency range and a first threshold frequency, and (ii) a second component that sweeps through frequencies between a second threshold frequency and a maximum of the calibration frequency range.

7. The first playback device of claim 1, wherein the calibration sound comprises a baseline tone that covers frequencies of the calibration frequency range within a given duration, and wherein the functions further comprise:
   selecting, as the calibration sound, a particular calibration sound that is substantially proportional in duration to a product of the given duration of the baseline tone and a number of channels formed in the particular playback configuration.

8. The first playback device of claim 1, wherein receiving a command to initiate calibration of the particular playback configuration comprises receiving the command from a controller device configured to control playback of audio content by the first playback device, and wherein receiving data indicating audio processing coefficients comprising receiving the data indicating the audio processing coefficients from the controller device.

9. A tangible, non-transitory computer-readable medium having stored thereon instructions that, when executed by one or more processors, cause a first playback device to perform functions comprising:
   forming a particular playback configuration that configures multiple audio transducers to form two or more channels, wherein each channel is formed by two or more audio transducers of the multiple audio transducers, and wherein the first playback device comprises a housing carrying the multiple audio transducers and one or more amplifiers configured to drive the multiple audio transducers;
   receiving a command to initiate calibration of the particular playback configuration, wherein the calibration comprises emitting a calibration sound according to a sequence, wherein the sequence comprises the calibration sound cycling through frequencies of a calibration frequency range;
   based on the command, emitting the calibration sound contemporaneously via the two or more channels, wherein emission of the calibration sound by each channel is staggered such that each emitted calibration sound is delayed relative to a preceding emitted calibration sound;

receiving data indicating audio processing coefficients that are based on one or more recordings of the emitted calibration sound; and applying the audio processing coefficients to audio content when playing back the audio content as part of the particular playback configuration.

10. The tangible, non-transitory computer-readable medium of claim 9, wherein the particular playback configuration is a surround sound playback configuration that configures the multiple audio transducers to form a front channel, a left channel, and a right channel.

11. The tangible, non-transitory computer-readable medium of claim 10, wherein the first playback device is in a bonded zone with one or more second playback devices that form respective surround channels, and wherein emitting the calibration sound comprises emitting the calibration sound contemporaneously with emission of the calibration sound by the one or more second playback devices, wherein emission of the calibration sound by each channel of the first playback device and emission of the calibration sound by each surround channel of the one or more second playback devices are staggered such that each emitted calibration sound is delayed relative to a preceding emitted calibration sound.

12. The tangible, non-transitory computer-readable medium of claim 9, wherein the particular playback configuration is a stereo pair playback configuration that configures the multiple audio transducers to form a left channel and a right channel.

13. The tangible, non-transitory computer-readable medium of claim 9, wherein the calibration sound comprises (i) a first component that includes noise frequencies between a minimum of the calibration frequency range and a first threshold frequency, and (ii) a second component that sweeps through frequencies between a second threshold frequency and a maximum of the calibration frequency range.

14. The tangible, non-transitory computer-readable medium of claim 9, wherein the calibration sound comprises a baseline tone that covers frequencies of the calibration frequency range within a given duration, and wherein the functions further comprise:

selecting, as the calibration sound, a particular calibration sound that is substantially proportional in duration to a product of the given duration of the baseline tone and a number of channels formed in the particular playback configuration.

15. A method to be performed by a first playback device, the method comprising:

forming a particular playback configuration that configures multiple audio transducers to form two or more channels, wherein each channel is formed by two or more audio transducers of the multiple audio transducers, and wherein the first playback device comprises a housing carrying the multiple audio transducers and one or more amplifiers configured to drive the multiple audio transducers;

receiving a command to initiate calibration of the particular playback configuration, wherein the calibration comprises emitting a calibration sound according to a sequence, wherein the sequence comprises the calibration sound cycling through frequencies of a calibration frequency range;

based on the command, emitting the calibration sound contemporaneously via the two or more channels, wherein emission of the calibration sound by each channel is staggered such that each emitted calibration sound is delayed relative to a preceding emitted calibration sound;

receiving data indicating audio processing coefficients that are based on one or more recordings of the emitted calibration sound; and applying the audio processing coefficients to audio content when playing back the audio content as part of the particular playback configuration.

16. The method of claim 15, wherein the particular playback configuration is a surround sound playback configuration that configures the multiple audio transducers to form a front channel, a left channel, and a right channel.

17. The method of claim 15, wherein the first playback device is in a bonded zone with one or more second playback devices that form respective surround channels, and wherein emitting the calibration sound comprises emitting the calibration sound contemporaneously with emission of the calibration sound by the one or more second playback devices, wherein emission of the calibration sound by each channel of the first playback device and emission of the calibration sound by each surround channel of the one or more second playback devices are staggered such that each emitted calibration sound is delayed relative to a preceding emitted calibration sound.

18. The method of claim 15, wherein the particular playback configuration is a stereo pair playback configuration that configures the multiple audio transducers to form a left channel and a right channel.

19. The method of claim 15, wherein the calibration sound comprises (i) a first component that includes noise frequencies between a minimum of the calibration frequency range and a first threshold frequency, and (ii) a second component that sweeps through frequencies between a second threshold frequency and a maximum of the calibration frequency range.

20. The method of claim 15, wherein the calibration sound comprises a baseline tone that covers frequencies of the calibration frequency range within a given duration, and wherein the method further comprises:

selecting, as the calibration sound, a particular calibration sound that is substantially proportional in duration to a product of the given duration of the baseline tone and a number of channels formed in the particular playback configuration.

* * * * *